United States Patent
Nguyen et al.

(10) Patent No.: US 12,444,618 B2
(45) Date of Patent: Oct. 14, 2025

(54) ETCHING METHOD AND ETCHING APPARATUS

(71) Applicant: Hitachi High-Tech Corporation, Tokyo (JP)

(72) Inventors: Thi-Thuy-Nga Nguyen, Aichi (JP); Kenji Ishikawa, Aichi (JP); Masaru Hori, Aichi (JP); Kazunori Shinoda, Tokyo (JP); Hirotaka Hamamura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/909,006

(22) PCT Filed: Oct. 21, 2021

(86) PCT No.: PCT/JP2021/038955
§ 371 (c)(1),
(2) Date: Sep. 2, 2022

(87) PCT Pub. No.: WO2023/067767
PCT Pub. Date: Apr. 27, 2023

(65) Prior Publication Data
US 2024/0222138 A1  Jul. 4, 2024

(51) Int. Cl.
*H01L 21/3213* (2006.01)
*H01J 37/32* (2006.01)

(52) U.S. Cl.
CPC .. *H01L 21/32136* (2013.01); *H01J 37/32449* (2013.01); *H01J 37/32522* (2013.01); *H01J 2237/3341* (2013.01)

(58) Field of Classification Search
None
See application file for complete search history.

(56) References Cited

U.S. PATENT DOCUMENTS

| 5,195,045 | A | 3/1993 | Keane et al. |
| 5,712,592 | A | 1/1998 | Stimson et al. |

(Continued)

FOREIGN PATENT DOCUMENTS

| JP | H06045326 A | 2/1994 |
| JP | H07254606 A | 10/1995 |

(Continued)

OTHER PUBLICATIONS

Patrick Verdonck, et al., "Analysis of the Etching Mechanisms of Tungsten in Fluorine Containing Plasmas", Journal of Electrochemical Society, 1995, vol. 142, No. 6, pp. 1971-1976.

(Continued)

*Primary Examiner* — Binh X Tran
(74) *Attorney, Agent, or Firm* — Miles & Stockbridge, P.C.

(57) ABSTRACT

A method for selective removal of a titanium aluminum carbide film against titanium aluminum nitride films by using near atmospheric pressure plasma that is a rich non-halogen radical source to produce various radicals (e.g. NH, H, $CH_x$, N, Ar, OH, O) from Ar and liquid vapor for film surface modification. The modified layer is able to form volatile products that can be easily removed by heating.

9 Claims, 23 Drawing Sheets

(56) References Cited

U.S. PATENT DOCUMENTS

| | | |
|---|---|---|
| 5,770,922 A | 6/1998 | Gerrish et al. |
| 6,265,831 B1 | 7/2001 | Howald et al. |
| 6,270,618 B1 | 8/2001 | Nakano et al. |
| 6,351,683 B1 | 2/2002 | Johnson et al. |
| RE38,273 E | 10/2003 | Gerrish et al. |
| 6,677,711 B2 | 1/2004 | MacGearailt |
| 6,919,689 B2 | 7/2005 | Jafarian-Tehrani et al. |
| 7,084,832 B2 | 8/2006 | Pribyl |
| 7,190,119 B2 | 3/2007 | Patrick et al. |
| 7,645,357 B2 | 1/2010 | Paterson et al. |
| 8,038,896 B2 | 10/2011 | Ikegami et al. |
| 8,546,266 B2 | 10/2013 | Mori et al. |
| 9,431,268 B2 | 8/2016 | Lill et al. |
| 9,548,228 B2 | 1/2017 | Chandrashekar et al. |
| 9,978,610 B2 | 5/2018 | Fung et al. |
| 2001/0022293 A1 | 9/2001 | Maeda et al. |
| 2002/0123229 A1 | 9/2002 | Ono et al. |
| 2004/0185670 A1 | 9/2004 | Hamelin et al. |
| 2006/0037704 A1 | 2/2006 | Iwata et al. |
| 2006/0048892 A1 | 3/2006 | Arase et al. |
| 2007/0044716 A1 | 3/2007 | Tetsuka et al. |
| 2007/0187362 A1* | 8/2007 | Nakagawa ............... C23F 4/00 216/81 |
| 2008/0128087 A1 | 6/2008 | Hayano et al. |
| 2008/0190893 A1 | 8/2008 | Mori et al. |
| 2008/0268645 A1 | 10/2008 | Kao et al. |
| 2008/0277062 A1 | 11/2008 | Koshimizu et al. |
| 2009/0023296 A1 | 1/2009 | Nishizuka |
| 2010/0258529 A1 | 10/2010 | Mori et al. |
| 2011/0297533 A1 | 12/2011 | Mori et al. |
| 2013/0228550 A1 | 9/2013 | Mori et al. |
| 2014/0102640 A1 | 4/2014 | Yokogawa et al. |
| 2014/0225503 A1 | 8/2014 | Mori et al. |
| 2015/0072533 A1 | 3/2015 | Muraki et al. |
| 2015/0107769 A1* | 4/2015 | Nakano ............... C23C 14/0641 204/192.15 |
| 2015/0132953 A1 | 5/2015 | Nowling et al. |
| 2015/0179464 A1 | 6/2015 | Wang et al. |
| 2015/0262829 A1 | 9/2015 | Park et al. |
| 2015/0270148 A1 | 9/2015 | Shinoda et al. |
| 2015/0357210 A1 | 12/2015 | Mori et al. |
| 2016/0035585 A1 | 2/2016 | Xiang et al. |
| 2017/0053810 A1 | 2/2017 | Yang et al. |
| 2017/0194166 A1 | 7/2017 | Tan et al. |
| 2018/0211824 A1 | 7/2018 | Kudo et al. |
| 2019/0067032 A1 | 2/2019 | Shinoda et al. |
| 2021/0242030 A1* | 8/2021 | Shinoda ............... H01J 37/18 |

FOREIGN PATENT DOCUMENTS

| | | |
|---|---|---|
| JP | H11185998 A | 7/1999 |
| JP | 2000091321 A | 3/2000 |
| JP | 2001185542 A | 7/2001 |
| JP | 2002343768 A | 11/2002 |
| JP | 2003347278 A | 12/2003 |
| JP | 2005259839 A | 9/2005 |
| JP | 2006066905 A | 3/2006 |
| JP | 2007059567 A | 3/2007 |
| JP | 2008244146 A | 10/2008 |
| JP | 2011082180 A | 4/2011 |
| JP | 2016139792 A | 8/2016 |
| JP | 2017063186 A | 3/2017 |
| JP | 2019040932 A | 3/2019 |
| TW | 200620454 A | 6/2006 |
| TW | 200802592 A | 1/2008 |
| TW | 200829087 A | 7/2008 |
| TW | 201533796 A | 9/2015 |
| WO | 2021002753 A1 | 1/2021 |

OTHER PUBLICATIONS

Search Report mailed Oct. 7, 2014 in U.S. Appl. No. 14/177,251.
Office Action mailed Jan. 19, 2015 in Korean Application No. 10-2014-0013325.
Office Action mailed Jan. 15, 2016 in Taiwanese Application No. 10520049730.
Office Action mailed Aug. 9, 2016 in Japanese Application No. 2013-112562.
Office Action mailed Jul. 13, 2018 in Korean Application No. 10-2014-0013325.
Office Action mailed Jul. 13, 2018 in Korean Application No. 10-2015-0053111.
Office Action mailed Sep. 26, 2018 in Taiwanese Application No. 107106284.
Search Report mailed Jul. 16, 2019 in International Application No. PCT/JP2019/016930.
Office Action mailed Apr. 20, 2021 in Japanese Application No. 2020-509124.
Office Action mailed May 11, 2021 in U.S. Appl. No. 16/646,057.
Allowance mailed Aug. 27, 2021 in U.S. Appl. No. 16/646,057.
Search Report mailed Jan. 18, 2022 in International Application No. PCT/JP2021/038955.
Written Opinion mailed Jan. 18, 2022 in International Application No. PCT/JP2021/038955.

* cited by examiner

ETCHING METHOD AND ETCHING APPARATUS

TECHNICAL FIELD

The present invention relates to an etching method and an etching apparatus of a metal carbide film.

BACKGROUND ART

Advanced fabrication of three-dimensional (3D) devices in semiconductor industry required to control isotropic etching of multiple metal gate materials made of titanium containing compounds. Controlling isotropic etching of dielectrics, semiconductors, and metals with high selectivity to the exposed materials plays an important role. Selective etches of metal gate is a challenge for multiple metal gate patterning in logic devices.

TiAlC belongs to high-melting point, high-hardness, and high-wear resistance materials, and that can be used in multi-layer structure of work function metal in a fin-type field effect transistor (FET) of a logic semiconductor device. There are only few reports for wet etching this material such as $H_2O_2$ mixtures. For example, in order to remove the target metal layers, such as TiN or TiAlC over an etch stop layer, such as TaN or $HfO_2$, an isotropic wet etching using $H_2O_2$ mixtures was applied; however, the metal gate on the masked devices can be damaged by prolonged wet etching due to a poor metal removability. This will induce a significant lateral etching of metal films under the patterning mask, resulting in a large N/P boundary shift. In the worst case, metal gate on the masked devices will be damaged by the wet etching. In addition, the pattern collapse that is caused by surface tension of a rinse liquid, is appeared along with miniaturization of a pattern. Following the device manufacturing process in producing three-dimensional element structures and miniaturization of processing dimensions, a strong demand of development of a high-performance etching method that have high selectivity and isotropy with respect to an underlying film and high processing-dimension controllability in an atomic layer level is required.

In the related art, etching titanium carbide that may contain aluminum using peroxide mixtures is disclosed in US 2015/0132953 A1 (PTL 1). In the method, the maximum selectivity of TiC over TiN can be obtained with the liquid mixture of ammonia, peroxide and water at the temperature of 25° C. in which the etch rate of TiC is 8.6 nm/min.

CITATION LIST

Patent Literature

[PTL 1]
US 2015/0132953 A1

SUMMARY OF INVENTION

Technical Problem

Dry etching for ternary material TiAlC has not developed yet. Plasma etching has a potential to etch this TiAlC material; however, etching the ternary materials with different properties for each element is a challenge when considering about the balance of the etch rate for not only for single element but also for binary bonding and ternary bonding. Considering about the volatile products, chlorine/bromine/iodine plasmas can be form volatile products such as $TiCl_4$ or $AlCl_3$ at lower temperatures; however, chlorine/bromine/iodine-based gases are corrosive and toxic, this needs intensive considerations for system set up and safety aspect. In comparison with chlorine plasma, fluorine plasma is more popular in plasma etching. However, a compound of $AlF_j$ that can be formed from fluorine plasma is a non-volatile product and needs additional ligand-exchange steps to form volatile products. Therefore, finding a non-chlorine/fluorine plasma chemistry to etch TiAlC is a challenge.

A development of a high-performance etching method with high selectivity and isotropy to an underlying film and high processing-dimension controllability in an atomic layer level in a gate electrode processing of a next-generation 3D-fin-shaped field effect transistors is strongly desired.

Solution to Problem

The present inventors have been developing a new dry etching method, called near atmospheric pressure plasma enhanced atomic layer etching (ALE-nAPP) for isotropic etching of the metal carbide with vapor injection of liquid sources.

Although vacuum plasma has good control over gas chemistry and possibly provides high energetic species in surface modification processes, atmospheric-pressure plasma (APP) has been studied intensively due to the miniaturization of equipment size as well as the reduced fabrication cost and energy consumption. Plasma is a source of ions, radicals, electronically excited particles, and photons in the visible and UV range. Ions, or charged particles have a very short lifetime and are difficult to reach the substrate surface that is far away from the plasma source, whereas radicals are more stable and are able to travel long distances in flowing gases or by diffusion. Those radicals play a key role for controlling isotropic etching for 3D multilayer semiconductor devices. In comparison to low pressure plasma with maximum electron density of $10^{12}$ $cm^{-3}$, APP can generate high plasma density ($10^{13-16}$ $cm^{-3}$). Hence, number of radicals from APP can be produced more than 1000 times as compared with that at low pressure plasma.

Here the technology of both continuous etching and atomic layer etching are applied. As for atomic layer etching, a cyclic etching can be treated self-limiting manner of selective removal of a film against the other films. In surface modification processes, fluxes and energies of ions, radicals, electronically excited particles, and photons in the visible and UV range should be controlled. Here radicals are more stable and are able to travel long distances in flowing gases or by diffusion in this apparatus. The near atmospheric pressure plasma has a high electron density ($10^{14}$ $cm^{-3}$), and a high radical density is produced. In comparison to low pressure plasma (electron density max. $10^{12}$ $cm^{-3}$), near atmospheric pressure plasma can produce high plasma density ($10^{13-15}$ $cm^{-3}$) for a large area at a remote region. Rich radical source that can work as a co-reactant or etchant species enhances the reaction rate with sample surface.

Vapors generated from liquid sources were injected into the plasma that contacts the sample surface for surface modifications of the TiAlC film. By using Ar gas/evaporated liquid mixtures, the plasma was generated for surface modifications of TiAlC film, that can reduce surface binding energy of the top layer and can be removed more easily by an additional step. The experiment was conducted with Ar/liquid vapor plasma to produce reactive species such as Ar, NH, OH, H, $CH_x$, $N_2$, and O radicals.

It was revealed that TiAlC surface was modified with the formation of hydroxides of Al and Ti and the removal of TiC and AlC when using $H_2O$ or $H_2O_2/H_2O$ mixture. In case of using ammonia-containing liquid vapor plasma, nitridation can be obtained. The modified layer with different properties can be removed during the plasma exposure step, or by additional steps, depending on each application. As illustrated in the drawing on FIG. 18 and FIG. 19, NH—H ($CH_x$) containing plasma shows a high potential for selective etching over TiN due to producing volatile products.

In a similar manner of the atomic layer etching, the modified layer with lower surface binding energy can be removed by an additional step. The reaction chemistry of nAPP at sample surface brings a large difference in chemical kinetics as compared with low pressure plasma. Rich radical source that can work as a co-reactant or etchant species enhances the reaction rate with the sample surface. Therefore, ALE-nAPP seeds the prospect of developing a high-performance etching method for isotropic and selective etching.

An object of the invention is to provide an etching method and etching apparatus for a metal carbide film such as a titanium aluminum carbide film or a titanium carbide film which are capable of high selective etching by different gas/vapor chemistry and high processing dimension controllability in an atomic layer level. The object and new features of the invention will become apparent from description of this specification and attached drawings.

To accomplish the above-described object, for example, configurations and procedures described in the attached claims are employed.

The present application includes a plurality of means to solve the above issue, and an example thereof is an etching method for etching a titanium aluminum carbide film, including: a first process of generating high-density reactive species, which include various mixtures of liquid vapor (ammonia, peroxide, ethanol, deionized water) with Ar gas at different working pressures, substrate temperatures and different designs of liquid vapors lines to treat the material, for example titanium aluminum carbide film; and a second process of vacuum-heating the treated material to remove the surface reaction layer that is formed on a surface of the titanium aluminum carbide film from the first process, as illustrated in FIG. 6. A design selective etching process of TiAlC over TiAlN, TiN, AlN by using ammonia plasma chemistries is demonstrated here by potentially producing volatile products only from TiAlC modified surface after the first plasma treatment, as illustrated in FIG. 7.

In addition, there is provided an apparatus that etches a titanium aluminum carbide film and includes: a rich radical plasma source, a processing chamber; a workpiece that is provided in the processing chamber, and includes the titanium aluminum nitride film on at least a part of a surface; a stage on which the workpiece is loaded; a vacuum dry pump that reduces a pressure of the processing chamber from atmospheric pressure to medium pressure; and a heating unit that heats the workpiece so as to remove a surface reaction layer that is formed on a surface of the titanium aluminum carbide film with the reactive species including OH, NH, H, $CH_x$, $N_2$, Ar radicals.

Advantageous Effects of Invention

An effect, which is obtained by a representative configuration of the invention disclosed in this specification, is as follows. According to the invention, it is possible to provide a technology of dry etching a titanium aluminum carbide film with high surface reaction with a rich radical source for isotropic etching and high selective etching over titanium aluminum nitride by different surface reaction chemistries. Instead of using fluorine or highly corrosive halogen-based chemistries, ammonia or $N_2$ and $H_2$ mixtures can be used. The method can be applied for other selective etch of other carbides (TiC, AlC) over nitrides (TiN, AlN).

DESCRIPTION OF EMBODIMENTS

Figure 1:
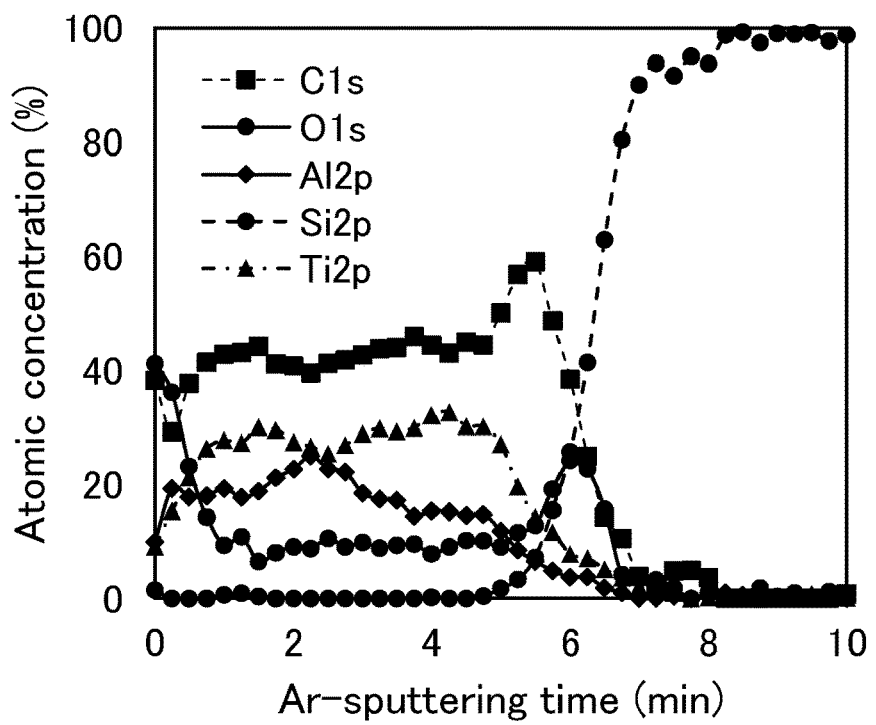
FIG. 1 is a view illustrating depth profile of atomic concentration in TiAlC films evaluated by X-ray photoelectron spectroscopy with Ar sputtering.
Figure 2A:
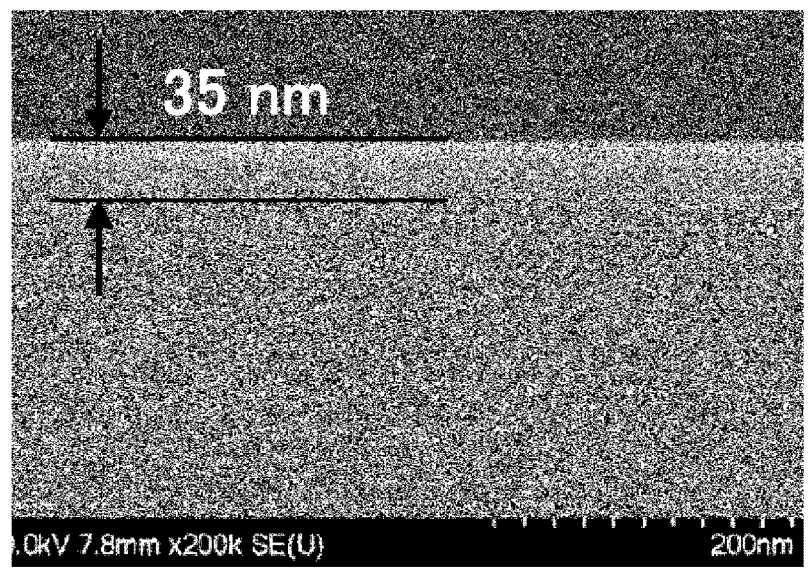
FIG. 2A is a view illustrating cross-sectional scanning electron microscope images of pristine TiAlC film.
Figure 2B:
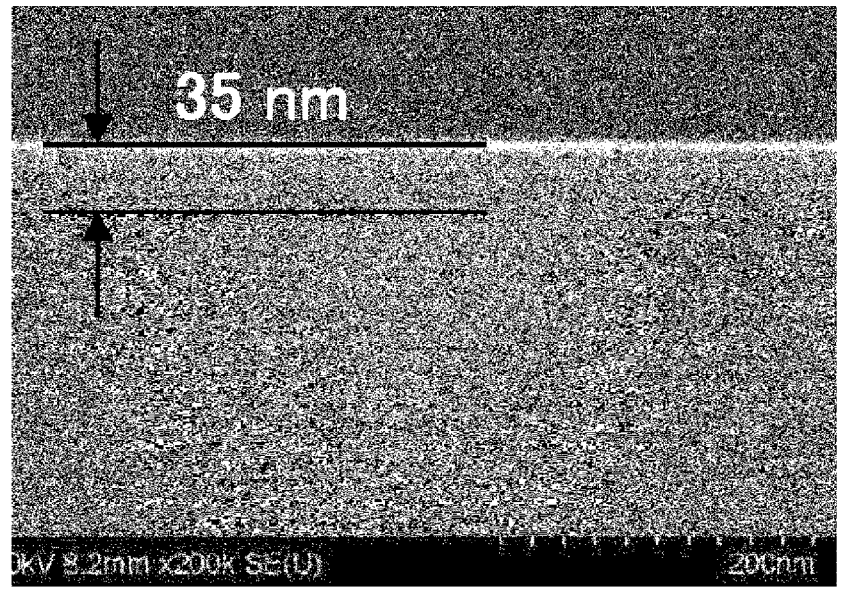
FIG. 2B is a view illustrating cross-sectional scanning electron microscope images of TiAlC film after wet chemical etching by $H_2O_2$ solution for 5 min.
Figure 2C:
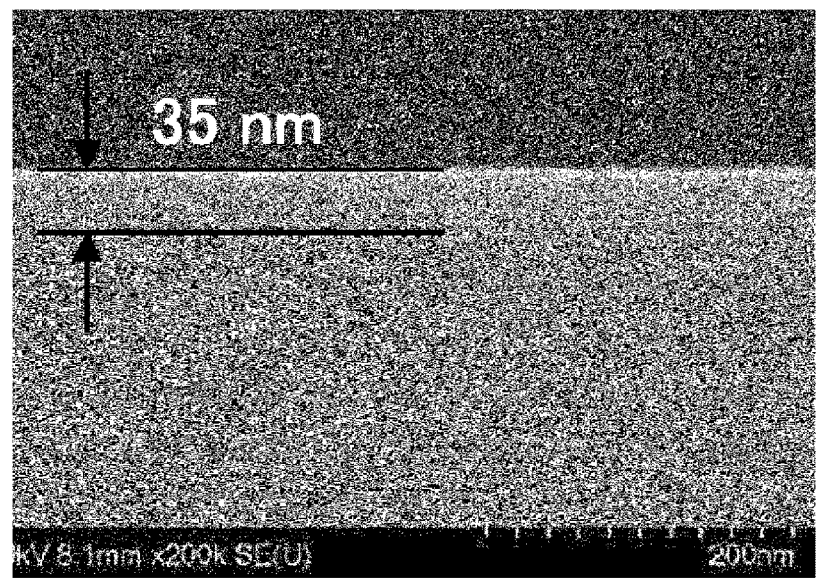
FIG. 2C is a view illustrating cross-sectional scanning electron microscope images of TiAlC film after wet chemical etching by $HCl/H_2O_2/H_2O$ (1:1:6) for 10 min.
Figure 2D:
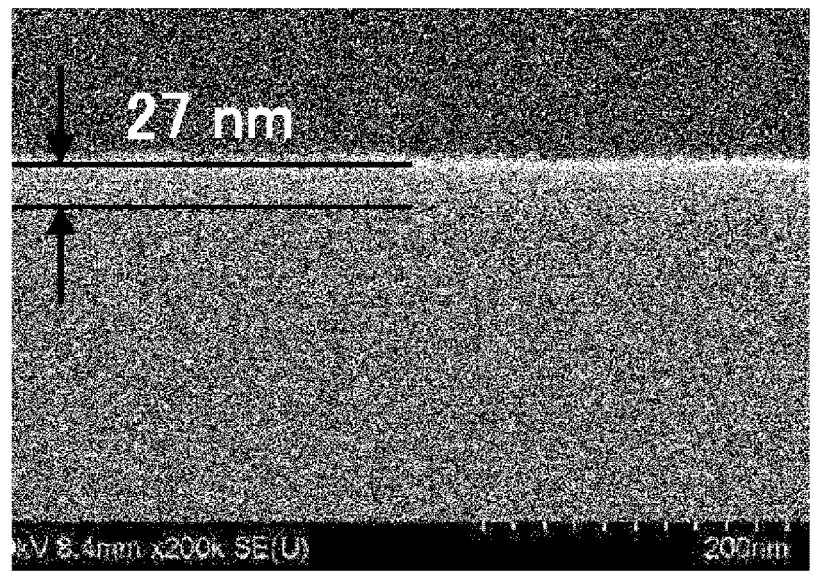
FIG. 2D is a view illustrating cross-sectional scanning electron microscope images of TiAlC film after wet chemical etching by $HCl/H_2O_2$ (10:1) for 10 min.
Figure 2E:
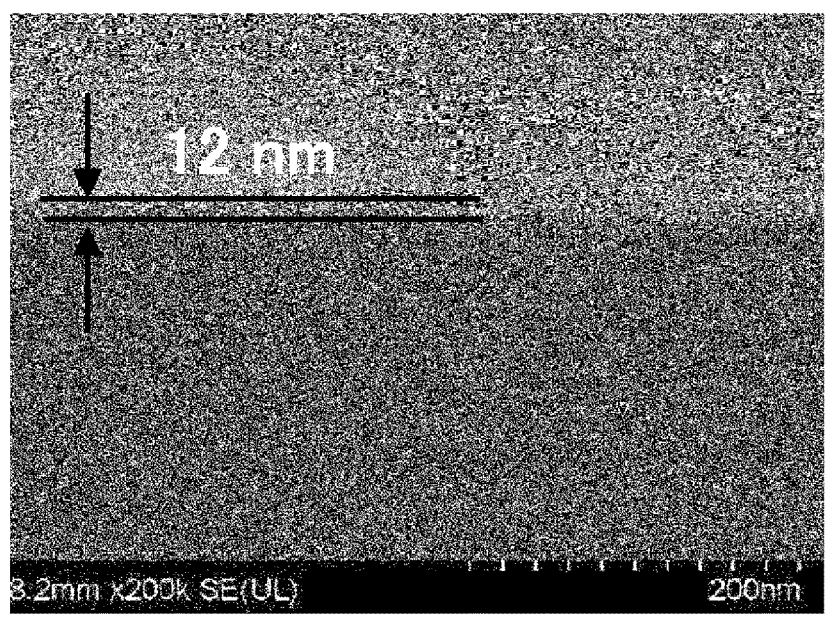
FIG. 2E is a view illustrating cross-sectional scanning electron microscope images of TiAlC film after wet chemical etching by $NH_4OH/H_2O_2/H_2O$ (2.2:3:52) for 10 min.

The present inventors have attempted to etch a titanium aluminum carbide film by using various kinds of gases. As a result, they obtained the following findings.

(1) In order to transfer etching chemistries from wet process to dry process, various plasma chemistries including various liquid vapors and gases were prepared to form various radical species by using a floating wire-assisted inductively coupled plasma (FW-ICP).

(2) Highly surface reaction occurred on the TiAlC surface when treated with different radicals. Modification of TiAlC surface was successfully produced. Modified layer can be removed during the radical treatment step if the temperature of the wafer is high enough for the desorption of the volatile products. Modified layer can be removed by additional annealing or ion bombardment with potential volatile products if the temperature of the wafer is not high enough for the desorption of the volatile products.

(3) Non-halogen-based gas was used. Non-halogen plasma was proposed for selective etching of metal carbides (TiAlC, TiC, AlC) over metal nitrides (TiAlN, TiN, AlN) by hydrogen-nitrogen plasma.

The present invention is made on the basis of the new findings. Specifically, the surface reaction layer is formed by supplying reactive species such as OH, NH, H, O, N, and $CH_x$ to a surface of the titanium aluminum carbide film. Working pressure was controlled from 0.5 kPa to 10 kPa. Temperature of substrate was controlled from 100° C. (without using heater) to 350° C. In addition, control of reactive species based on NH—CH plasma can have a potential for highly selective etching of metal carbides over metal nitrides.

According to the etching technology of the present invention, by using rich radical plasma source FW-ICP, highly surface reaction with radical can occurred for self-limiting aspect. This is potential to develop an ALE-nAPP for a high-performance etching method for isotropic and selective etching.

Hereinafter, the invention will be described in detail in embodiments with reference to the accompanying drawings. Furthermore, in all drawings referenced to describe the embodiments, the same reference numeral will be given to a constituent element having the same function, and redundant description thereof will not be repeated. In addition, in the drawings referenced to describe the embodiments, hatching may be given for easy understanding of a configuration even in a plan view.

<Reference of Wet Process>

This section describes an example in which wet etching chemistries of TiAlC were investigated with various liquid mixtures from peroxide (30 wt %), hydrochloric acid solution (36 wt %), ammonium hydroxide (29 wt %), and deionized water.

FIG. 1 is a view illustrating depth profile of atomic concentration in 35 nm TiAlC film on Si substrate evaluated by X-ray photoelectron spectroscopy with Ar sputtering at 3 KeV, 1 μA for a sputter area of 2 mm×2 mm. A native oxide (Al—O, Ti—C, C=O) layer with around 40% oxygen atomic concentration was removed after 1.5 min. The ratio of Ti:Al:C:O is around 28:22:40:10. Oxygen also exists inside the TiAlC film around 10% even after removing native oxide. The oxygen concentration increases to 20, at the interface between TiAlC film and Si substrate surface for the Si—O—C bonding.

FIGS. 2A to 2E are views illustrating cross-sectional scanning electron microscope images of TiAlC film before and after wet chemical etching in various solutions: (FIG. 2A) pristine TiAlC, (FIG. 2B) etched by $H_2O_2$ solution for 5 min, (FIG. 2C) etched by HCl/$H_2O_2$/$H_2O$ (1:1:6) for 10 min, (FIG. 2D) etched by HCl/$H_2O_2$ (10:1) for 10 min, and (FIG. 2E) etched by $NH_4OH$/$H_2O_2$/$H_2O$ (2.2:3:52) for 10 min. No etching occurred with $H_2O_2$ solution or with ammonium hydroxide or diluted mixture of HCl with $H_2O_2$ in which volume ratio of HCl/$H_2O_2$/$H_2O$ is 1:1:6. A low etch rate of 0.8 nm/min can be obtained with the mixture of HCl/$H_2O_2$ (10:1). Higher etch rate of 2.3 nm/min can be obtained by using $NH_4OH$/$H_2O_2$/$H_2O$ (2.2:3:52).

Figure 3:
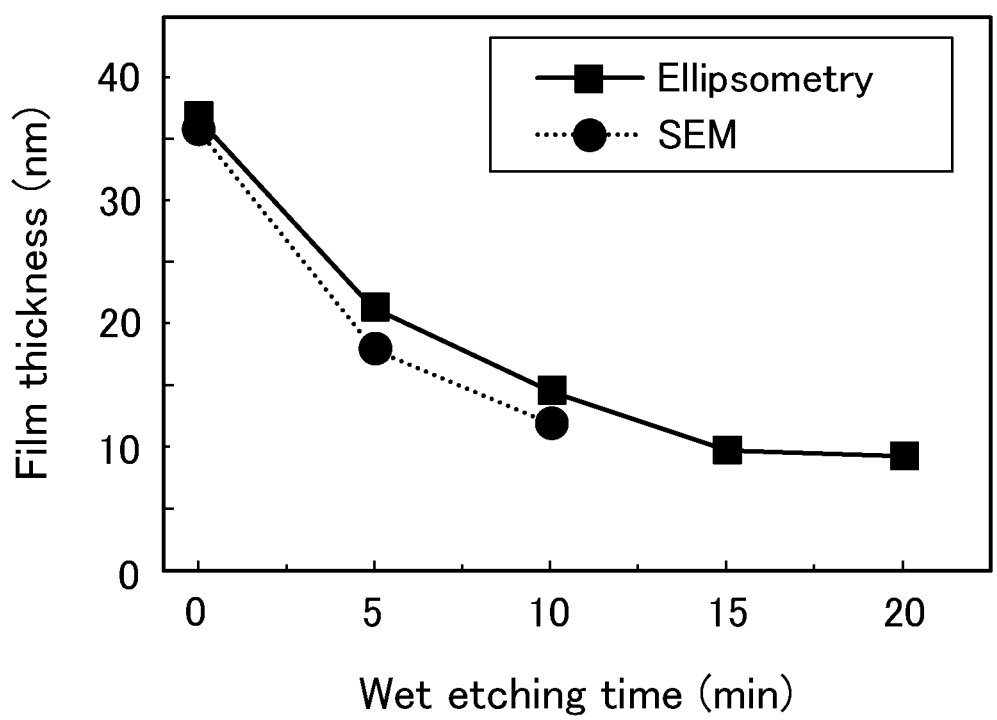
FIG. 3 is a view illustrating thickness of TiAlC film as a function of etching time in $NH_4OH/H_2O_2/H_2O$ (2.2:3:52) liquid mixture. Film thickness was evaluated by using both ellipsometer and scanning electron microscope.

FIG. 3 is a view illustrating thickness of TiAlC film as a function of etching time in $NH_4OH$/$H_2O_2$/$H_2O$ (2.2:3:52) liquid mixture. The etch rate decreases from 4.9 nm/min to 2.1 nm/min when etch time increases from 5 min to 15 min due to C—C layer formed on the TiAlC surface and a decrease of Al concentration when TiAlC film thickness reduces (Table 1). Table 1 presents film thickness of TiAlC and surface layer etched by $NH_4OH$/$H_2O_2$/$H_2O$ (2.2:3:52)

liquid mixture. Film thickness of Table 1 was evaluated by using ellipsometer. Etch stop for Si—C—C at the interface between TiAlC film and Si substrate.

TABLE 1

| | Pristine TiAlC | | After (NH$_4$OH, H$_2$O$_2$, H$_2$O) wet etching | | | |
|---|---|---|---|---|---|---|
| Etch time (min) | FT (oxide) | FT (TiAlC) (nm) | FT (oxide, modified layer) (nm) | FT (TiAlC) (nm) | ER-total film (nm/min) | ER-TiAlC (nm/min) |
| 5  | 3.7 | 32.7 | 13.3 | 8.1 | 3.0 | 4.9 |
| 10 | 3.8 | 32.6 | 11.7 | 3.0 | 2.3 | 3.1 |
| 15 | 3.8 | 33.2 | 7.4  | 2.4 | 1.8 | 2.1 |
| 20 | 3.8 | 33.0 | 7.1  | 2.2 | Etch stop | Etch stop |

Figure 4:
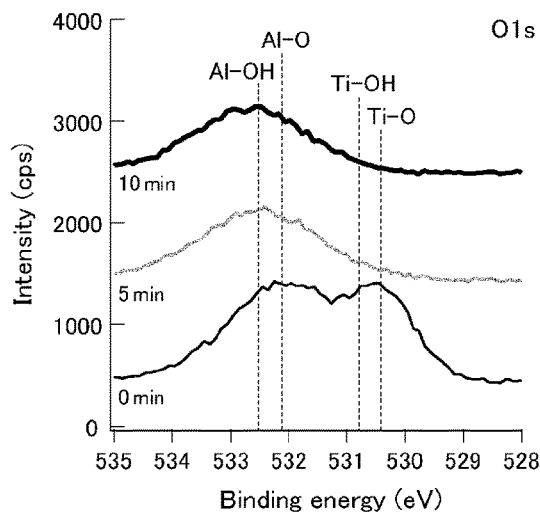
FIG. 4 is a view illustrating X-ray photoelectron spectra obtained on the surface of TiAlC film after wet chemical etching in $NH_4OH/H_2O_2/H_2O$ (2.2:3:52) liquid mixture at room temperature. Etching time was used as a parameter in the range from 0 to 10 min.
Figure 4:
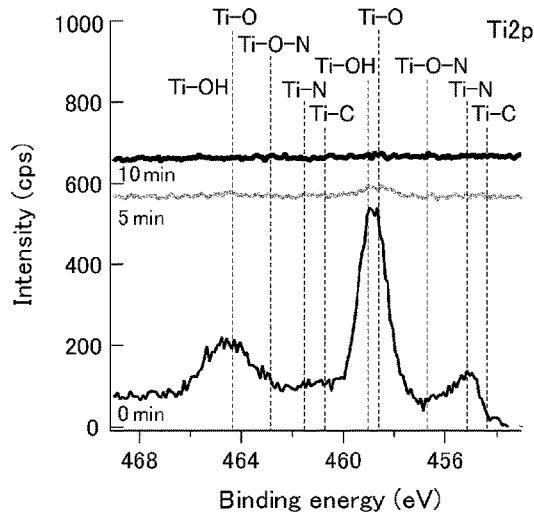
Figure 4:
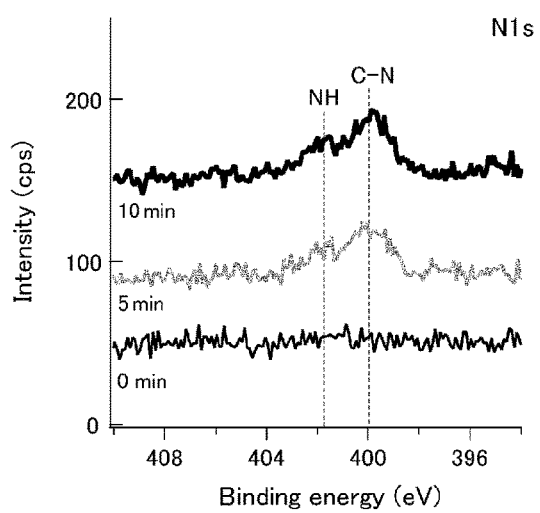
Figure 4:
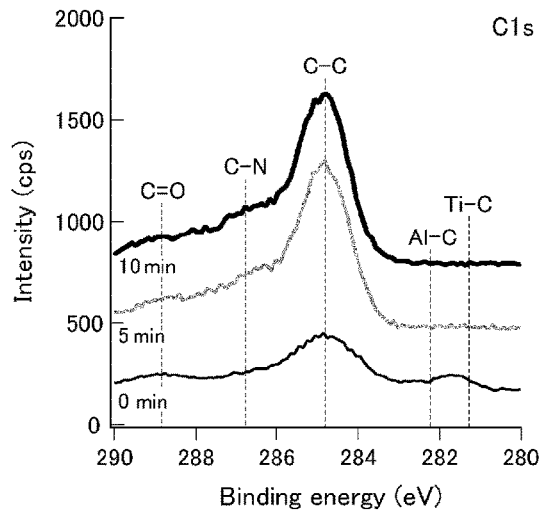
Figure 4:
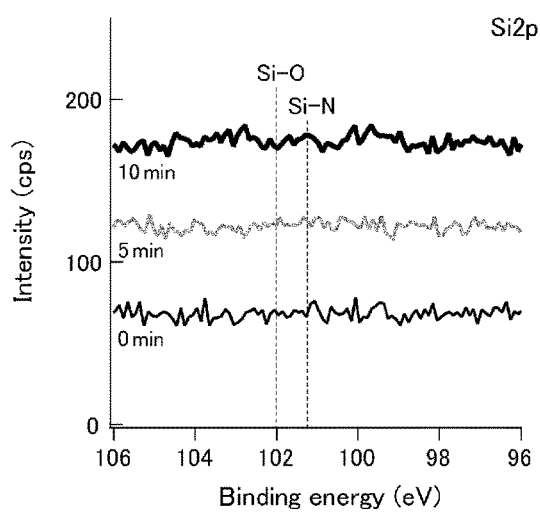
Figure 4:
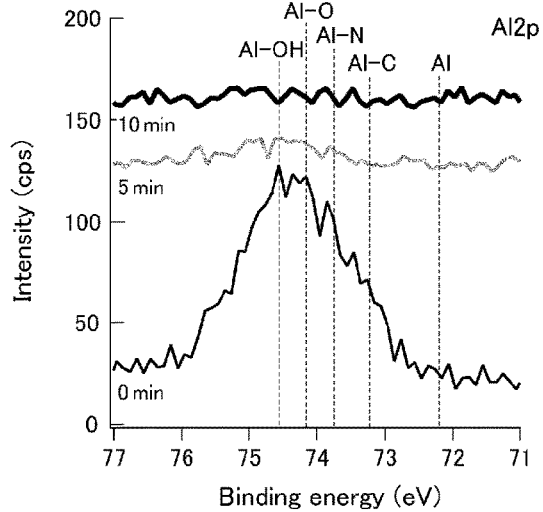

FIG. 4 is a view illustrating X-ray photoelectron spectra using Kα-rays of aluminum obtained on the surface of TiAlC film after wet chemical etching in NH$_4$OH/H$_2$O$_2$/H$_2$O (2.2:3:52) liquid mixture at room temperature. Ti 2p and Al 2p were significantly reduced after 5 min etching, whereas C—C bonding (C is) was rapidly increased. This indicates the C—C bonding from C in TiAlC is not able to dissolve in NH$_4$OH/H$_2$O$_2$/H$_2$O liquid mixture. N—H and C—N peaks can be found in (N is) spectra after 5 min etching.

Wet chemical etching of TiAlC film brings potential chemistries for the development of dry etching of TiAlC film. H, N and O that are elements included in NH$_4$OH/H$_2$O$_2$/H$_2$O liquid mixture or their combination such as NH$_2$, CH$_x$, OH, CN can be candidates for reactive species in plasma etching of TiAlC.

Example Process 1

Figure 5:
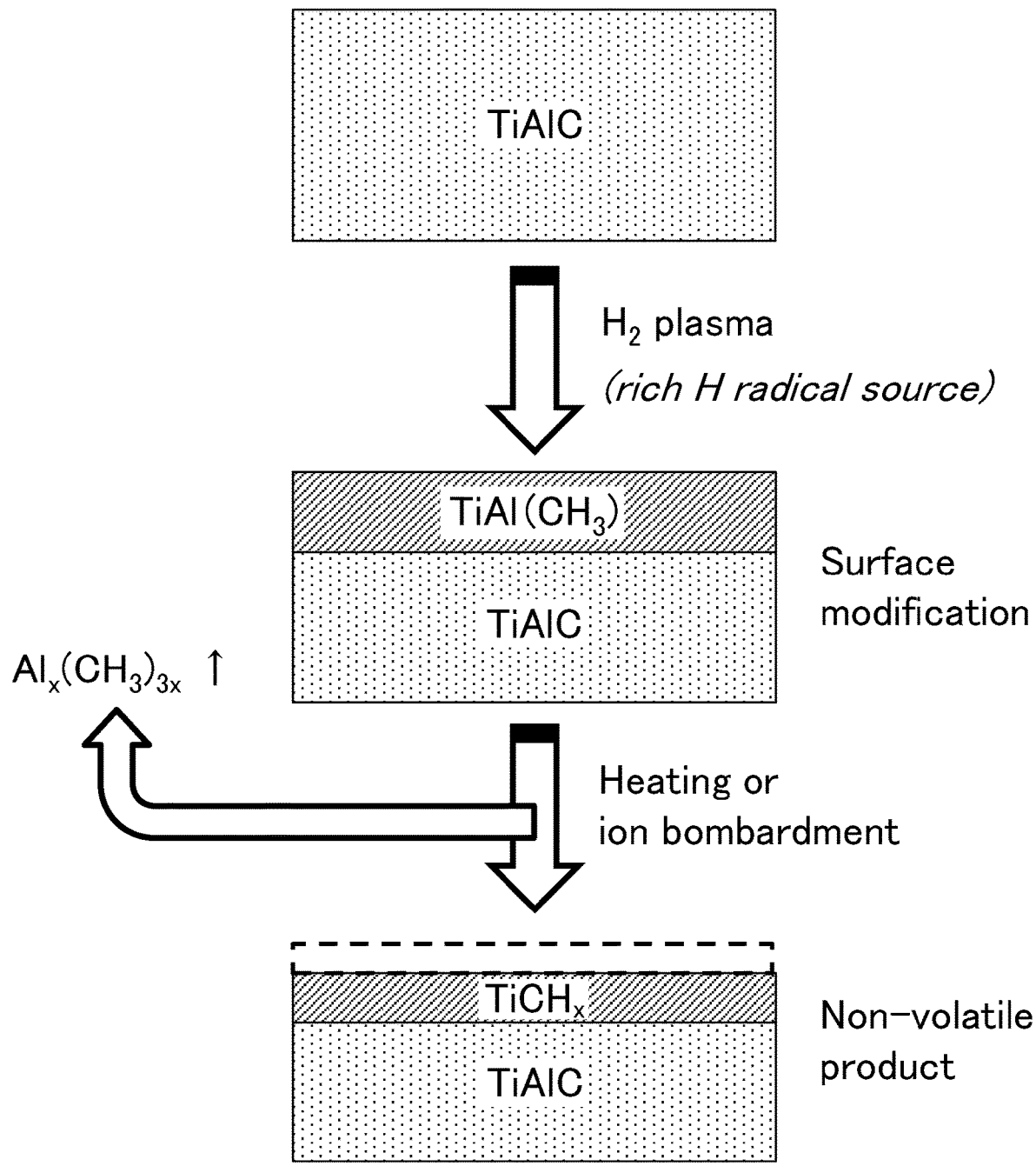
FIG. 5 is a view illustrating an example of plasma etching TiAlC using $H_2$ plasma.

The best example of this invention will be described with reference to FIG. 5 to FIG. 7. The description will be given of an example in design a dry plasma etching process of titanium aluminum carbide films on a silicon wafer and selected plasma chemistries for high selectivity of metal carbides (TiAlC, TiC, AlC) over metal nitrides (TiAlN, TiN, AlN). The wafer will be processed in a chamber in introducing of liquid vapor with radical generations by using a rich radical plasma source (nAPP). The hydrogen-containing and nitrogen-containing radicals can modify the metal carbides to form metal nitrides with formation of metal-nitrogen binding hydrocarbons which are desorbed by heating of the wafer. A cycle of the radical modification and the removal of metalorganic volatile can be etched selectively only metal carbides against metal nitrides.

Before explanation of the best example, basic processes of the dry plasma etching method will be described. FIG. 5 is a view illustrating an example of plasma etching of TiAlC using H$_2$ plasma. Hydrogen radical can be penetrated to the TiAlC surface to form CH$_3$ group. This is potential to produce volatile product Al$_x$(CH$_3$)$_{3x}$. Therefore, binary alloy of aluminum carbide can be etched by optimization of the hydrogen-containing radical irradiation with surface heating processes or ion bombardments. However, Ti(CH$_3$), compound is unstable and may reverse to TiC that is a non-volatile product and is difficult to remove by heating when considering about anisotropic etching. Thus, before this invention, any ternary or multiple elemental metal-carbide had not been etched chemically by any dry etching method.

As a result of earnest study, we invent a method for evaporation of titanium carbide selectively against titanium nitride. An importance is a use of high-density radicals generated in high density plasma of ammonia vapor injection. In addition, to increase rates for processing, it is also better to carry out the process at near atmospheric pressure and a cycle of surface modification for desorbed precursor formation and subsequence of removal of the modified layer by heating of substrate or ion bombardments. Details are as follows.

Figure 6:
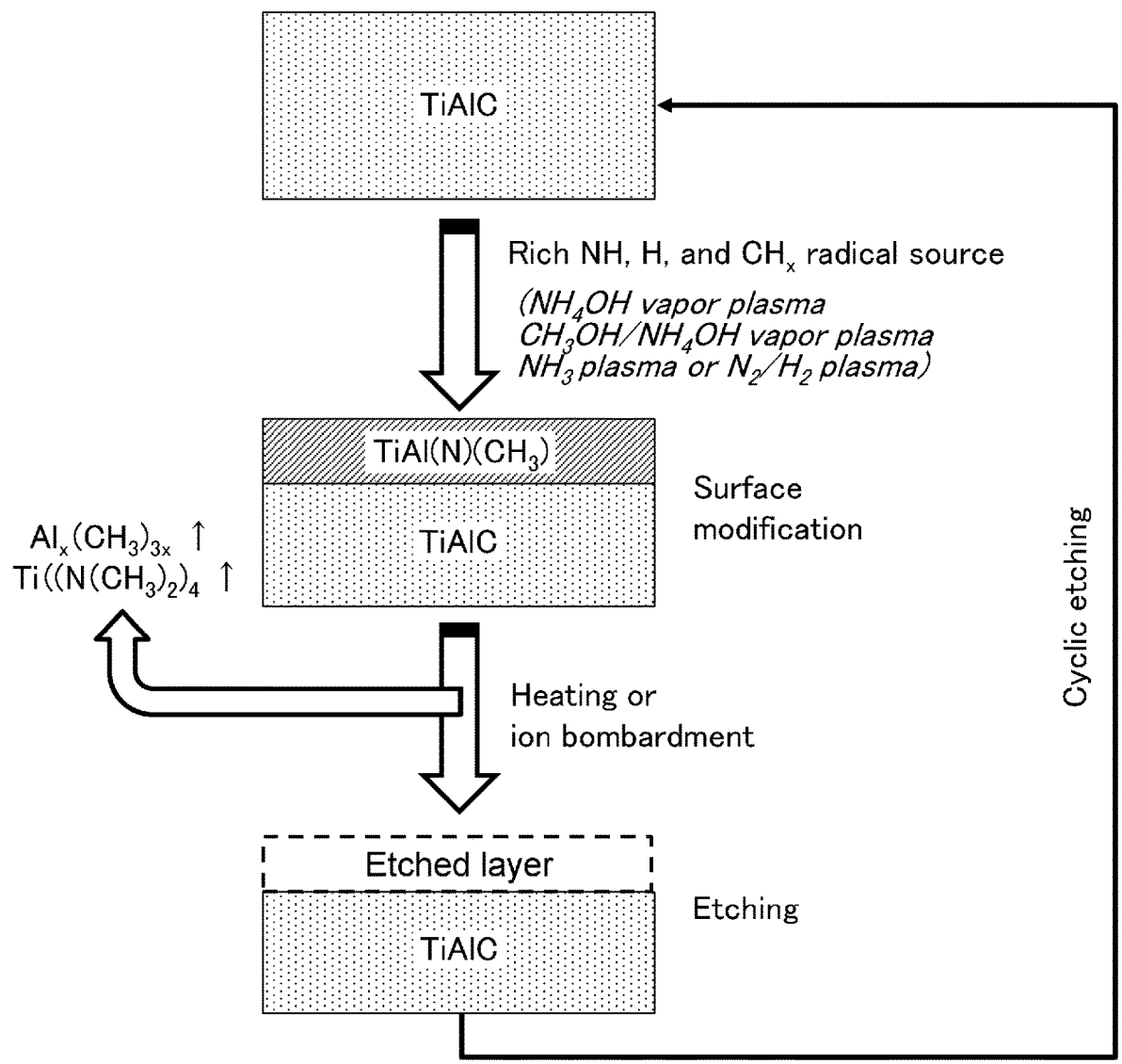
FIG. 6 is a view illustrating an example of a design of a plasma etching process for TiAlC material using rich N—H ($CH_x$) radical source and modified layer removed by heating or ion bombardment.
Figure 7:
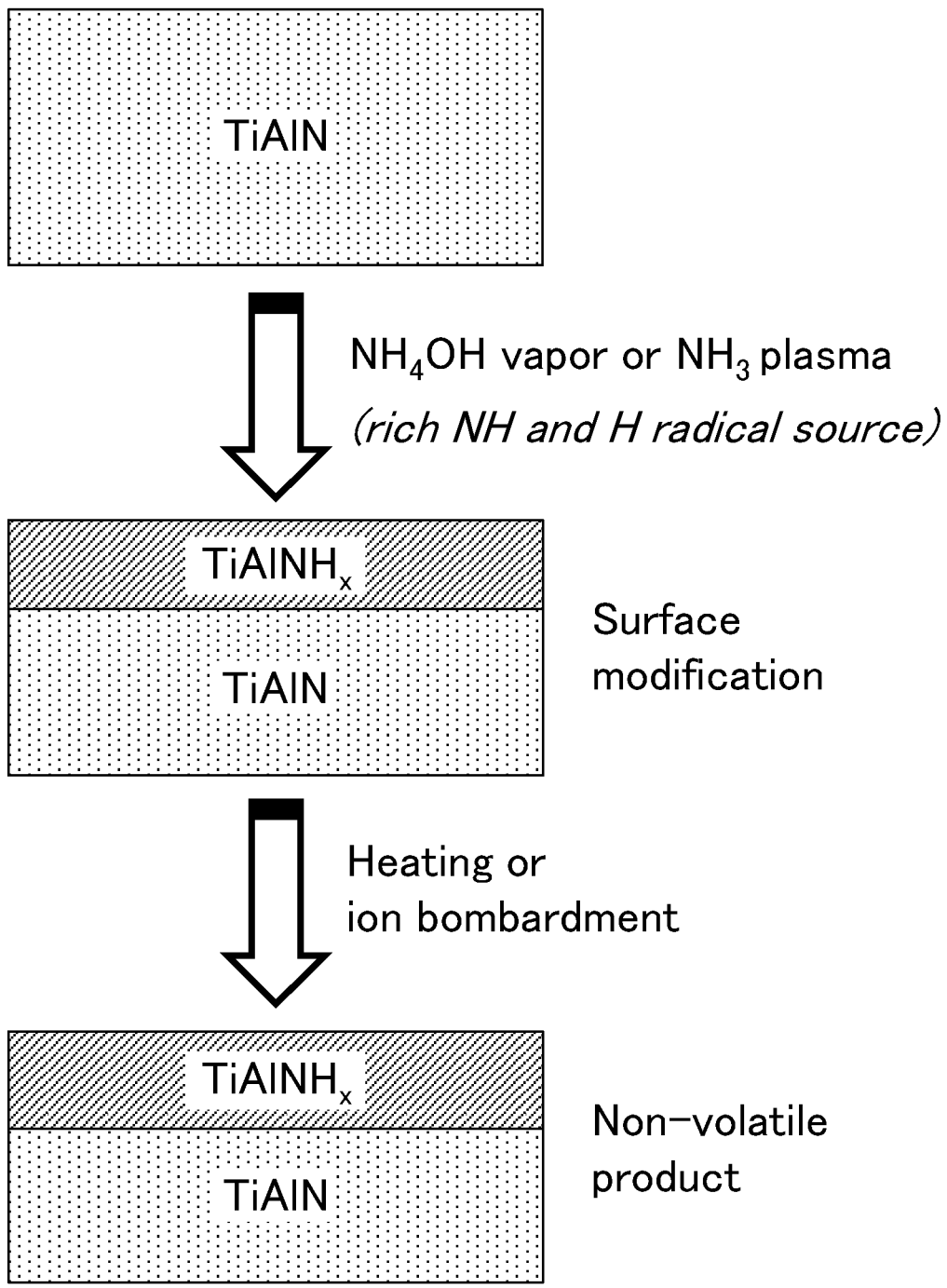
FIG. 7 is a view illustrating an example of selective plasma etching of TiAlC over TiAlN, TiN, AlN using N—H ($CH_x$) radical source.

FIG. 6 is a view illustrating an example of a design of a plasma etching process for TiAlC material using rich N—H (CH$_x$) radical source and modified layer removed by heating or ion bombardment. The reactive radicals can be produced by NH$_4$OH vapor plasma, C$_n$H$_{2n+1}$OH/NH$_4$OH vapor plasma (n<=10), NH$_3$ plasma, H$_2$/NH$_3$ plasma, N$_2$/NH$_3$ plasma, or N$_2$/H$_1$ plasma or their mixtures. The modified layer can be volatile such as Al(CH$_3$)$_3$ and its dimer or trimer, Ti(N(CH$_3$)$_2$)$_4$, Ti(OC$_n$H$_{2n+1}$)$_4$ by heating when considering about isotropic etching or ion bombardment. Rich radical source can react with the TiAlC surface to form self-limiting reaction. Hence, the process from forming modified layer, self-limiting, and removing the modified layer by heating can be controlled precisely for each cycle. This is potential to develop the atomic layer etching by using near atmospheric pressure plasma (AlE-nAPP).

In contrast, the nitride surface will be further taken place of only nitridation. This means that the selective removal of the carbides against the nitrides. FIG. 7 is a view illustrating an example of selective plasma etching of TiAlC over TiAlN, TiN, AlN using N—H (CH$_x$) radical source. By using the same etching process with TiAlN material, TiAlNH, can be formed. However, this modified layer is difficult to be volatile by heating.

Surface modification including Oxidation, hydrogenation, carbonization, and nitridation to form Al—CH$_3$, Ti—N—CH$_3$ or Ti—O—CnH$_{2n}$+$_1$ bondings on TiAlC surface plays an important role to form volatile products such as Al(CH$_3$)$_3$ and its dimer or trimer, Ti(N(CH$_3$)$_2$)$_4$, Ti(OC$_n$H$_{2n+1}$)$_4$. These modified surfaces can be removed by heating or ion bombardment. Thermal heating is preferable with an expect of isotropic etching. Selective plasma etching of TiAlC over TiAlN, TiN, or AlN can be obtained by using N—H (CH$_x$) radical source with the formation of non-volatile product (TiAlNH). Formation of modified layer with self-limiting effect can be obtained by a rich radical source nAPP. Removal of the modified layer by heating can be potential to control precisely for each cycle. This is able to develop the atomic layer etching by using near atmospheric pressure plasma (AlE-nAPP).

The etching mechanism of the atomic layer etching is the same with the etching mechanism of the continuous etching. The difference is due to a temperature to form the modified surface. Lower temperature, e.g. from −40° C. to 80° C., leads to the atomic layer etching. Higher temperature, e.g. from 100° C. to 300° C. leads to the continuous etching, because both forming and removal of the modified layer proceeds in parallel.

Example Process 2

A second embodiment will be described with reference to FIG. 8 to FIG. 12. The description will be given of an example in development of a dry plasma etching of titanium aluminum carbide film on a silicon wafer by using Ar/liquid vapor plasma. In this embodiment, the liquid vapor is produced from the peroxide solution or a mixture of NH$_4$OH/H$_2$O$_2$/H$_2$O. Ar plasma is used for the dissociation of liquid vapor to generate reactive species in FW-ICP system. Pressure range is from 0.5 kPa to 70 kPa, and temperature range is from 145° C. to 300° C. It may be lowered the temperature than 145° C. at a longer working distance or a lower VHF power.

Figure 8:
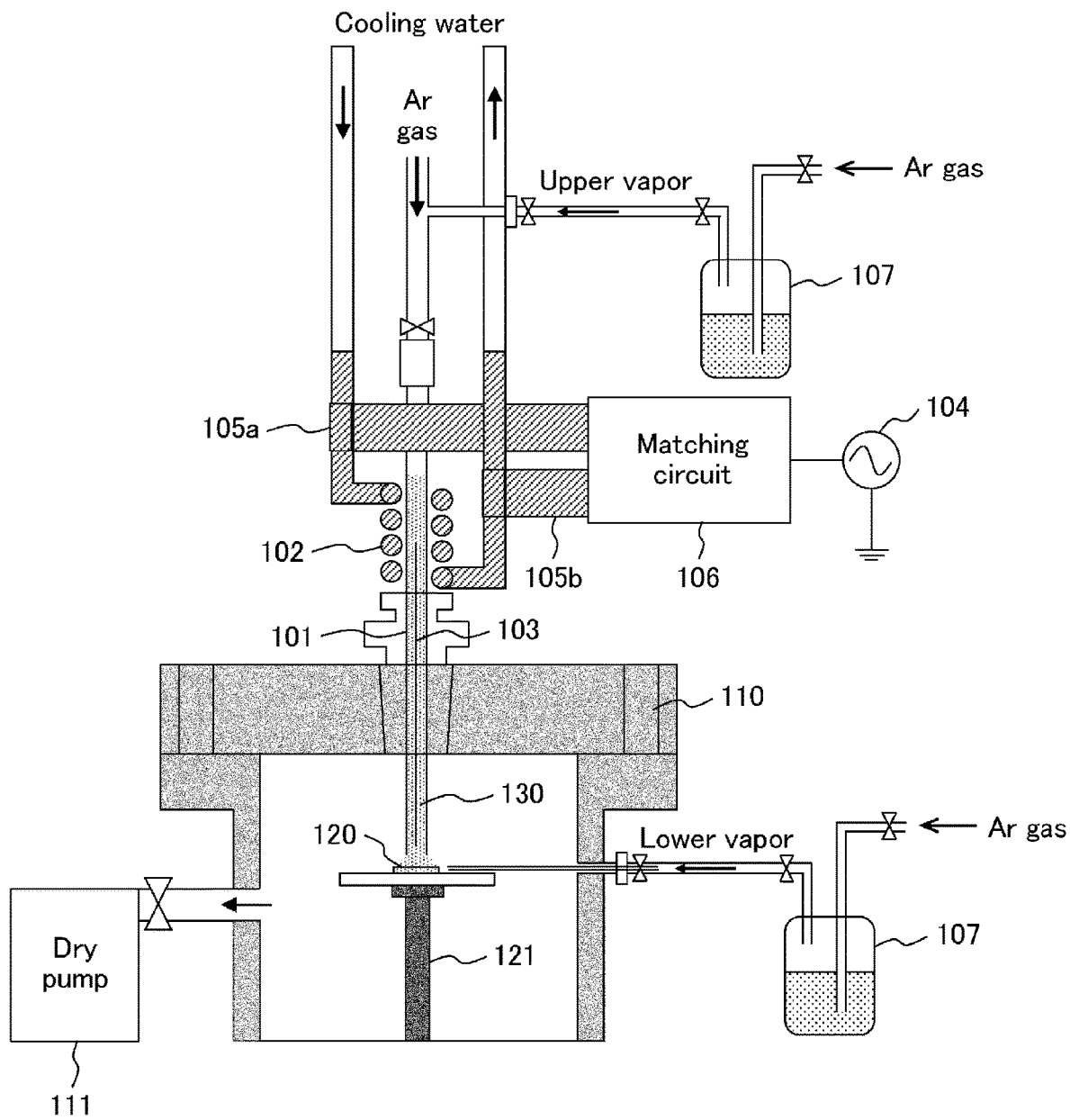
FIG. 8 is a schematic cross-sectional view of an etching apparatus using floating wire-assisted inductively coupled plasma with vapor injection of liquid sources.

FIG. 8 is a schematic cross-sectional view of an etching apparatus using floating wire-assisted inductively coupled plasma with vapor injection of liquid sources. The plasma source consisted of a 500-mm-high discharge quartz tube 101 (I shape) with a three-turn Cu coil 102 and a long floating metal wire 103 placed inside. The plasma 130 was produced using a VHF power supply 104 (100 MHz). Two copper foils 105a, 105b of thickness 0.3 mm were used to connect between the output of a matching circuit 106 of the power supply 104 and the Cu coil 102. The Cu coil 102 was cooled down by circulating an electrical-insulating coolant from a cooling system. The discharge tube 101 was connected with a process chamber 110 and a dry pump 111. The long floating metal wire 103 (more than 130 mm length) is designed to improve the plasma generation at the remote region (downstream) by enhancing electric field at remote region. The floating metal wire 103 is covered by a protected material to avoid the chemical reaction with plasma species. Main gas and liquid vapors are flowed into the reaction region by two gas lines (upstream line and downstream line). The liquid vapor flow rate can be controlled by additional Ar gas flow or by heating the liquid canister 107 or pressure difference between the canister 107 and main chamber 110. A sample 120 is placed on a heating stage 121.

Figure 9:
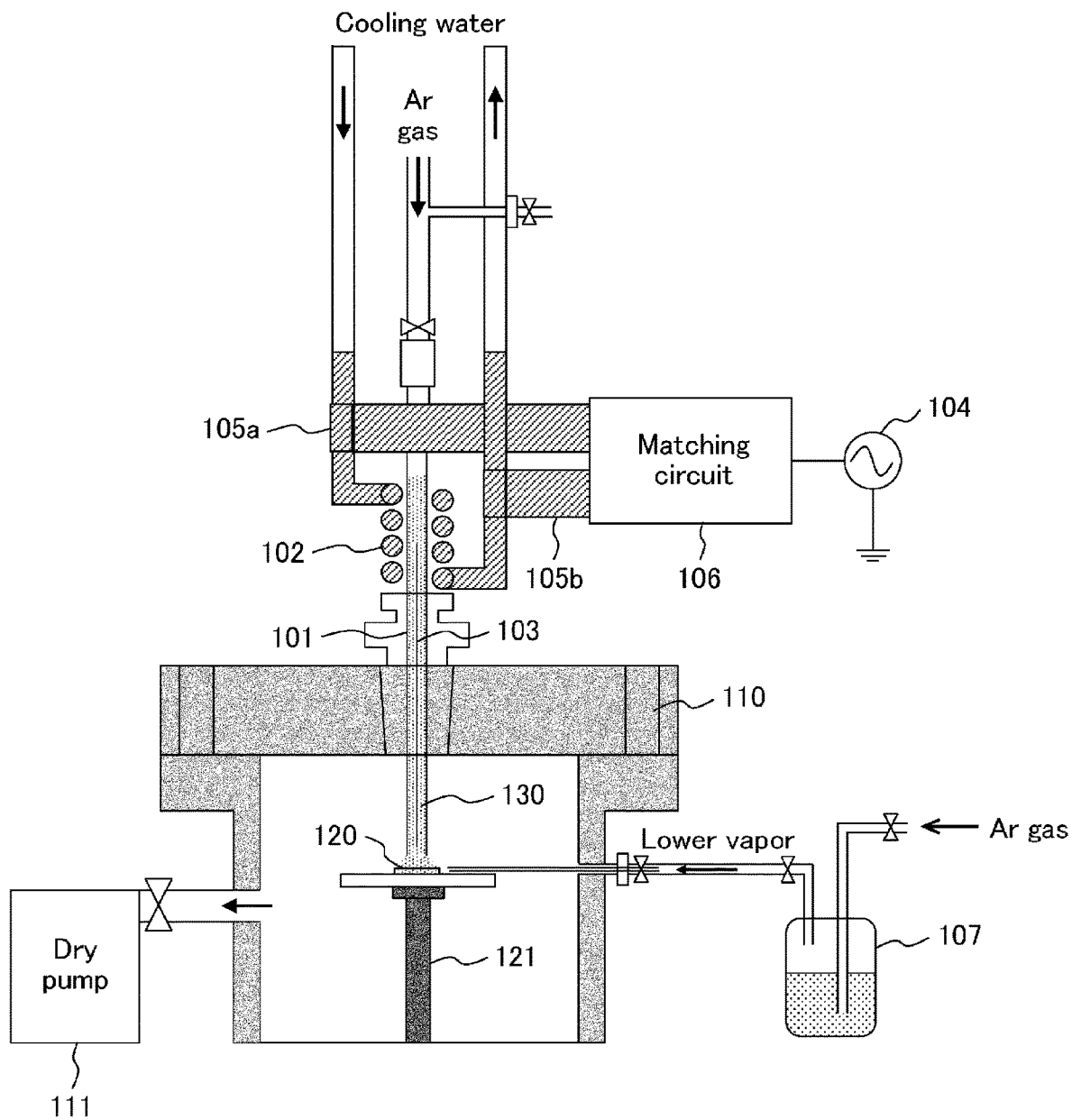
FIG. 9 is a schematic cross-sectional view of an etching apparatus using floating wire-assisted inductively coupled plasma with lower vapor injection of liquid sources.

FIG. 9 is a schematic cross-sectional view of an etching apparatus using floating wire-assisted inductively coupled plasma with lower vapor injection of liquid sources at downstream region. Liquid vapor is injected at downstream region where Ar plasma is used for the dissociation of the liquid vapor to generate reactive species.

Figure 10:
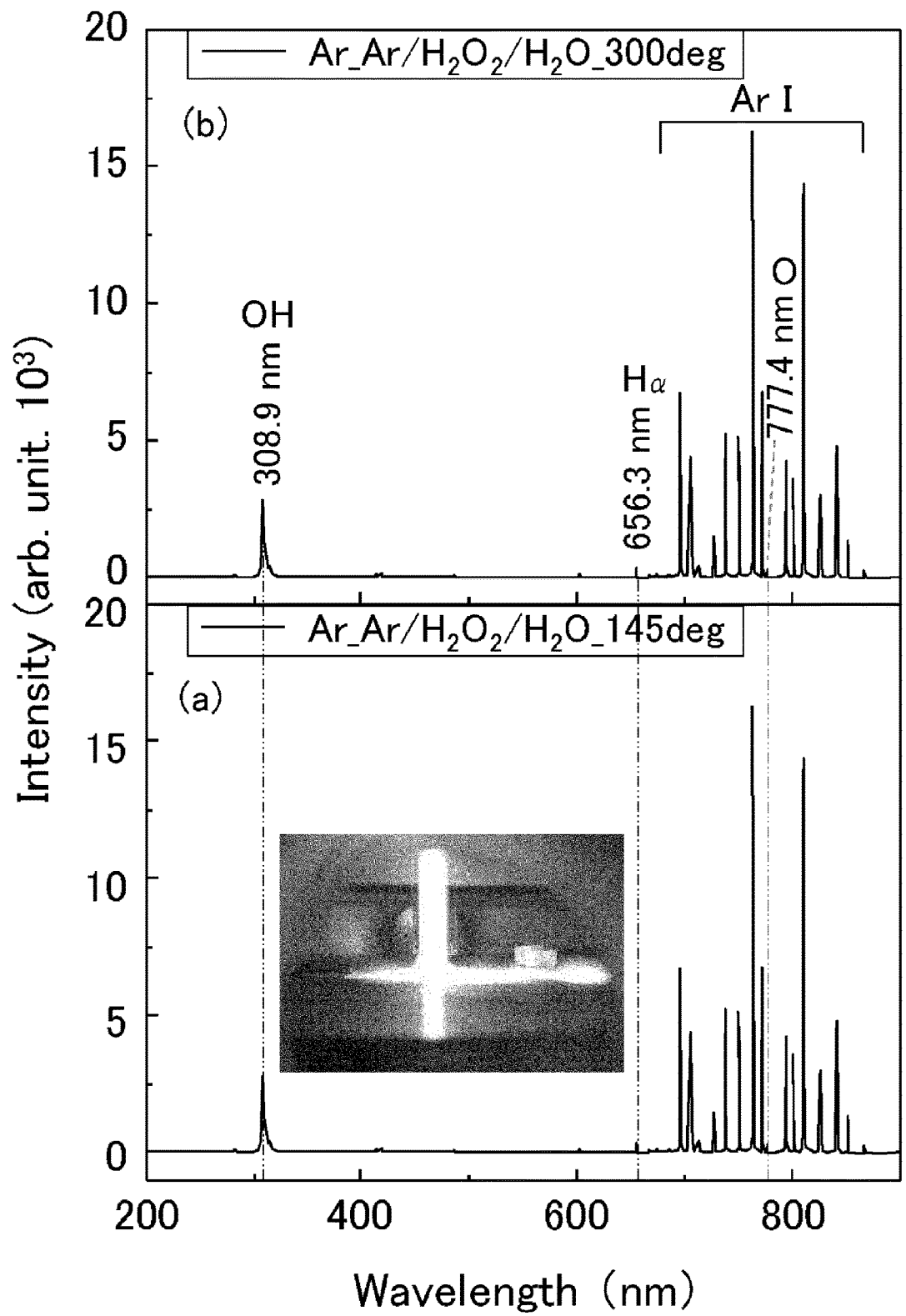
FIG. 10 is a view illustrating optical emission spectra and a photograph image of plasma obtained by Ar plasma (upstream) with $Ar/H_2O_2/H_2O$ vapor at substrate temperatures (a) 145° C. (without heater), and (b) 300° C. (with heater).

FIG. 10 is a view illustrating optical emission spectra and photograph images of plasmas obtained by Ar plasma (upstream) with Ar/H$_2$O$_2$/H$_2$O vapor at substrate temperatures of (a) 145° C. and (b) 300° C. at 100 W and 10 kPa. Liquid vapor was controlled by using additional Ar flow to the liquid and the canister is heated to 80° C. In addition to Ar species, OH, H$_\alpha$, and O radicals can be detected in plasma. In case of using a heater to control the substrate temperature of 300° C., the intensity of OH and H$_\alpha$ increases due to some water molecular was desorbed from the substrate and chamber wall.

Figure 11:
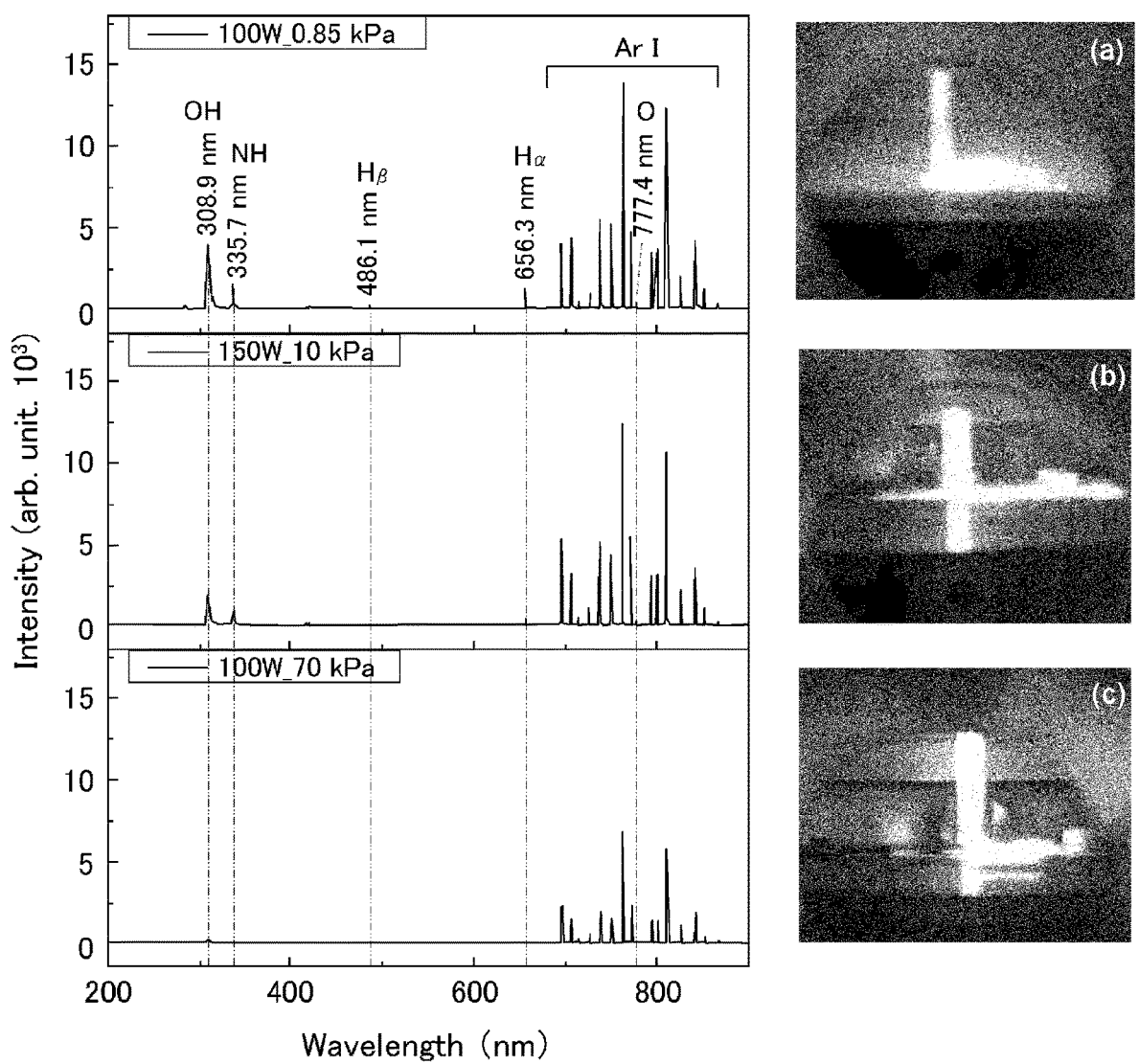
FIG. 11 is a view illustrating optical emission spectra and photograph images of plasmas generated with Ar plasma (upstream) and $Ar/NH_4OH/H_2O_2/H_2O$ lower vapor obtained for various conditions: (a) 100 W, 0.85 kPa (b) 150 W, 10 kPa, and (c) 100 W, 70 kPa.

FIG. 11 is a view illustrating optical emission spectra and photograph images of plasmas generated with Ar plasma (upstream) and Ar/NH$_4$OH/H$_2$O$_2$/H$_2$O lower vapor obtained for various conditions: (a) 100 W, 0.85 kPa (b) 150 W, 10 kPa, and (c) 100 W, 70 kPa. The mixture contains peroxide (30 wt %), hydrochloric acid solution (36 wt %), ammonium hydroxide (28 wt %), and deionized water. The volume ratio of NH$_4$OH/H$_2$O$_2$/H$_2$O liquid mixture is 2.1:3.1:52. The plasma expands larger when the pressure decreases. At high pressure (70 kPa), the OH intensity is quite weak, and no obvious NH peak can be detected. In addition to the OH, H$_\alpha$, and O, NH peak can be detected when the pressure decreases to 10 kPa, and 0.85 kPa. In this setup, the OH intensity is much stronger than NH intensity.

Figure 12:
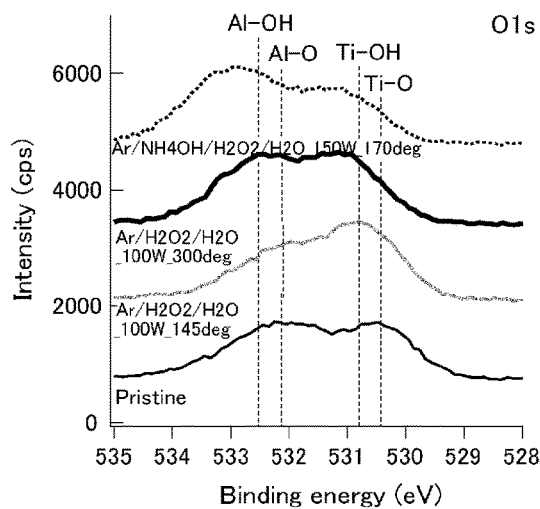
FIG. 12 is a view illustrating X-ray photoelectron spectra obtained on the surface of TiAlC film before and after 20-min exposure to plasma generated with Ar plasma (upstream) and $Ar/H_2O_2/H_2O$ or $Ar/NH_4OH/H_2O_2/H_2O$ vapor (downstream) at various substrate temperatures.
Figure 12:
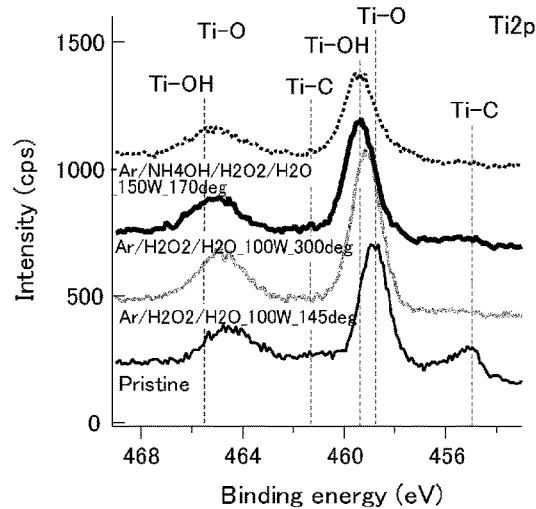
Figure 12:
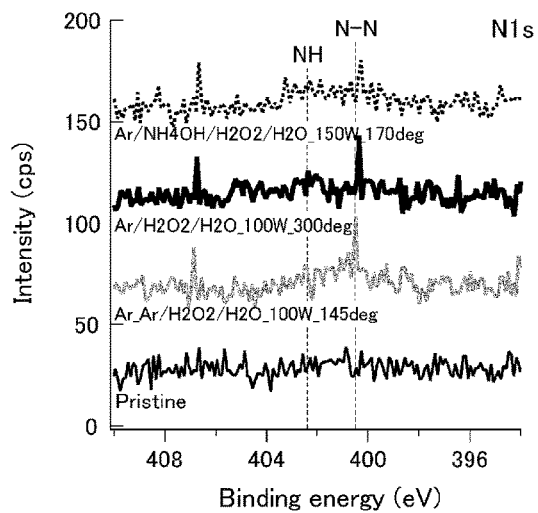
Figure 12:
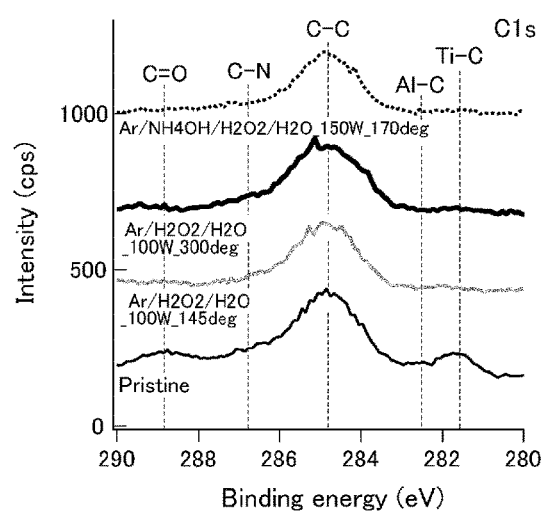
Figure 12:
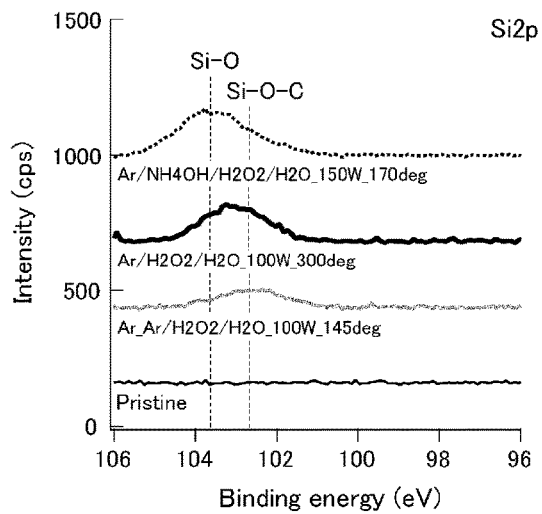
Figure 12:
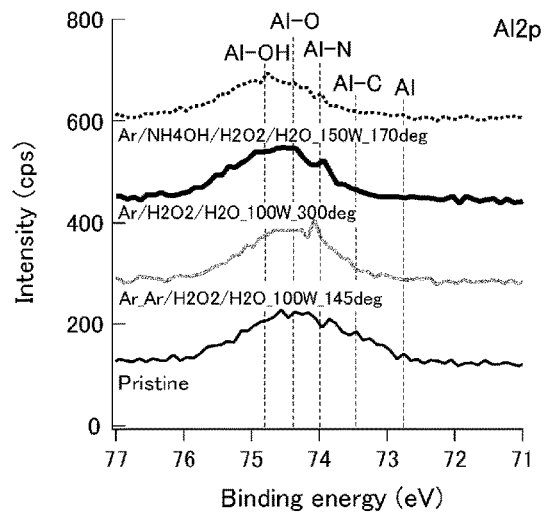

FIG. 12 is a view illustrating X-ray photoelectron spectra obtained on the surface of TiAlC film before and after 20-min exposure to plasma generated with Ar plasma (upstream) and Ar/H$_2$O$_2$/H$_2$O or Ar/NH$_4$OH/H$_2$O$_2$/H$_2$O vapor (downstream) at various substrate temperatures. Ti—C, Al—C, and C=O peaks are disappeared, indicating that carbon in TiAlC can be etched by all Ar/liquid vapor plasmas. Ti—O and Al—O peaks are left-shifted as a result of Ti—OH and Al—OH formation. A weak NH peak can be detected.

In this setup, OH and O radicals are more dominant as compared with NH radicals. As a result, C from TiAlC can be etched while hydroxides such as TiO$_x$N$_y$(OH), and AlO$_x$N$_y$(OH), are formed with a small N concentration.

Example Process 3

A third embodiment will be described with reference to FIG. 13 to FIG. 19. The description will be given of an example in development of a dry plasma etching of titanium aluminum carbide film on a silicon wafer by using upper Ar/liquid vapor plasma in FW-ICP. The selection of liquid vapor sources can change a composition of radicals. Basically, a water vapor is a source of OH radical and an ammonia vapor is a source of NH radical. To monitor an optical emission spectrum, the composition can be controlled and used for optimization of the modification processes to match any compositional forms of Ti—Al—C films.

Figure 13:
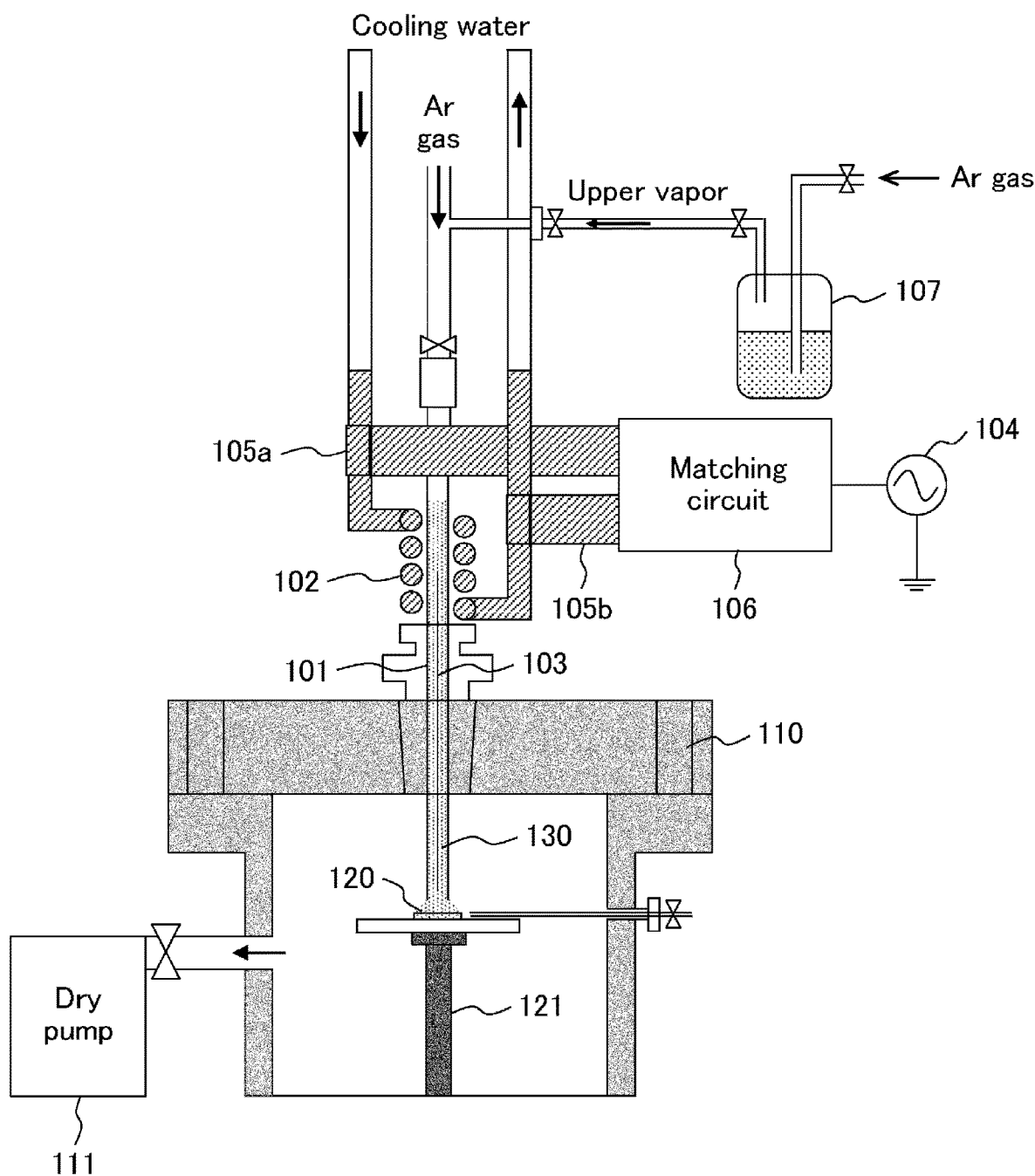
FIG. 13 is a schematic cross-sectional view of an etching apparatus using floating wire-assisted inductively coupled plasma with upper vapor injection of liquid sources.

FIG. 13 is a schematic cross-sectional view of an etching apparatus using floating wire-assisted inductively coupled plasma with upper vapor injection of liquid sources. Ar/liquid vapor plasmas are generated along the discharge tube 101. The liquid vapor is produced from various mixtures of deionized water, ammonium hydroxide (28 wt %), and 2 mol/l ammonium ethanol solution. In addition, H$_2$ gas and N$_2$/NH$_3$ mixture gas are also used. Pressure range is from 0.65 kPa to 10 kPa, and temperature range is from 150° C. to 330° C.

Figure 14:
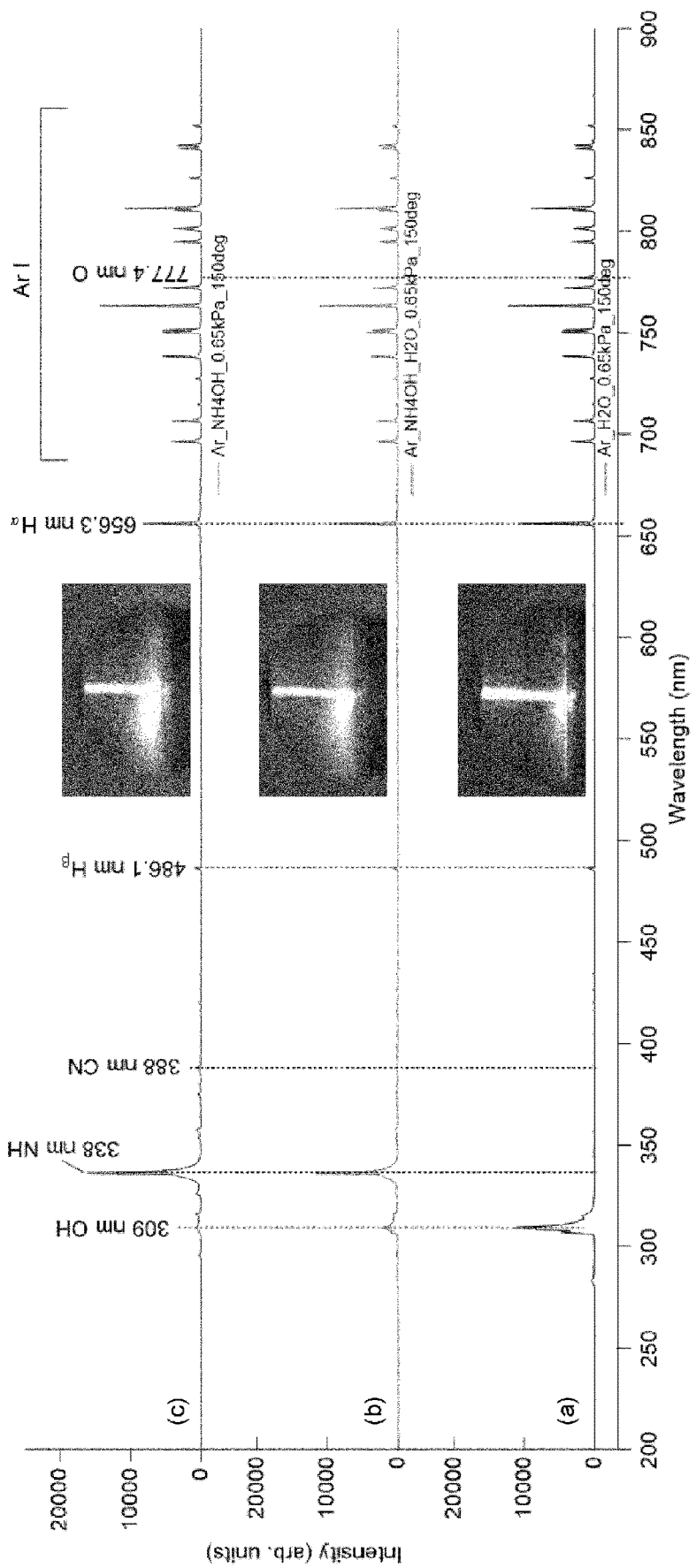
FIG. 14 is a view illustrating optical emission of plasmas generated with (a) Ar/$H_2O$ plasma, (b) Ar/$NH_4OH$/$H_2O$ plasma, (c) Ar/$NH_4OH$ at 100 W, 0.65 kPa, 150° C.

FIG. 14 is a view illustrating optical emission of plasmas generated with (a) Ar/H$_2$O plasma, (b) Ar/NH$_4$OH/H$_2$O plasma, (c) Ar/NH$_4$OH at 100 W, 0.65 kPa, 150° C. Various plasma colors with different liquid vapor mixtures. Strong OH, NH, H$_\alpha$ emission lines as compared with Ar emission are detected. Intensity of OH/NH can be controlled by different liquid mixtures. H$_\beta$ and N$_2$ (approximately 370 nm) is also detected. Higher density of reactive radical species can be generated in this setup.

Figure 15:
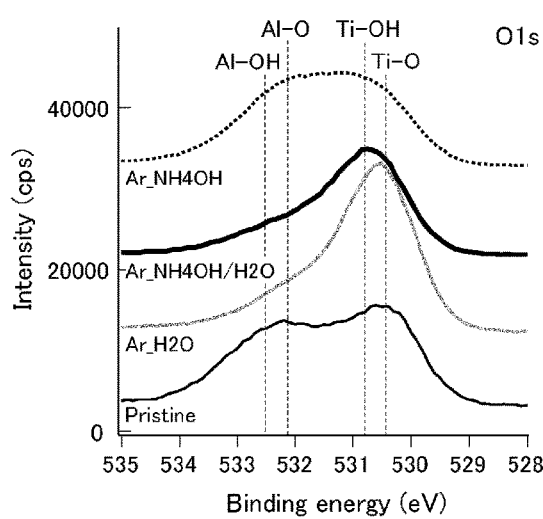
FIG. 15 is a view illustrating X-ray photoelectron spectra obtained on the surface of TiAlC film before and after 10-min exposure to plasma generated with (a) Ar/$H_2O$ plasma, (b) Ar/$NH_4OH$/$H_2O$ plasma, (c) Ar/$NH_4OH$ at 100 W, 0.65 kPa, 150° C., 10 min.
Figure 15:
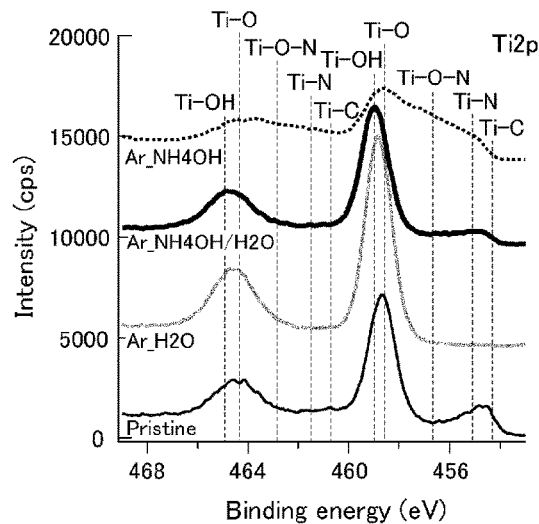
Figure 15:
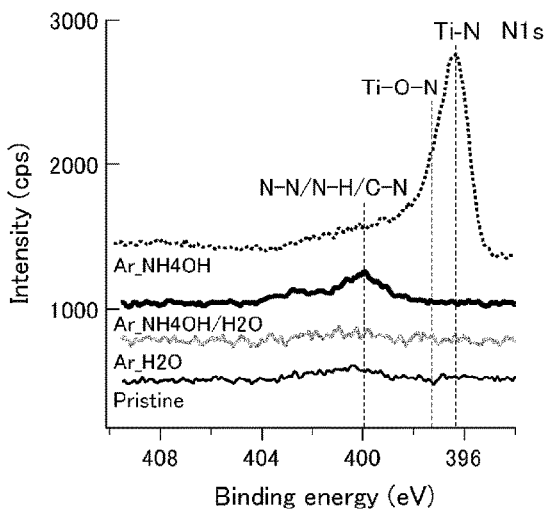
Figure 15:
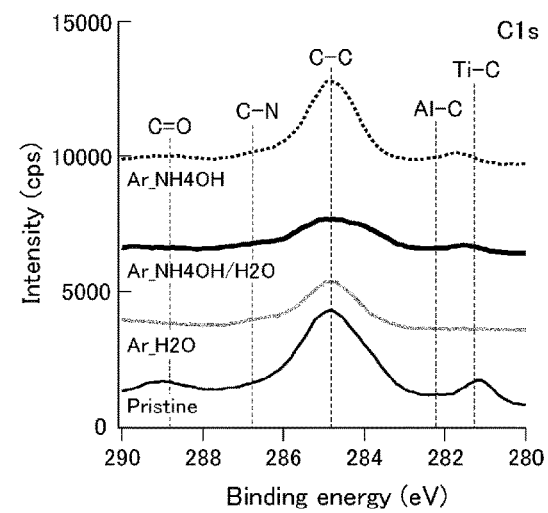
Figure 15:
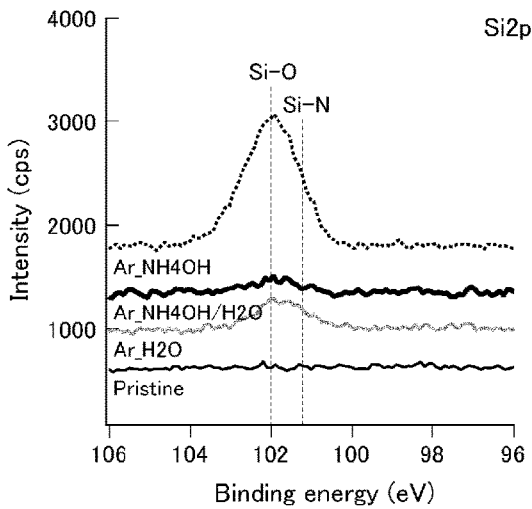
Figure 15:
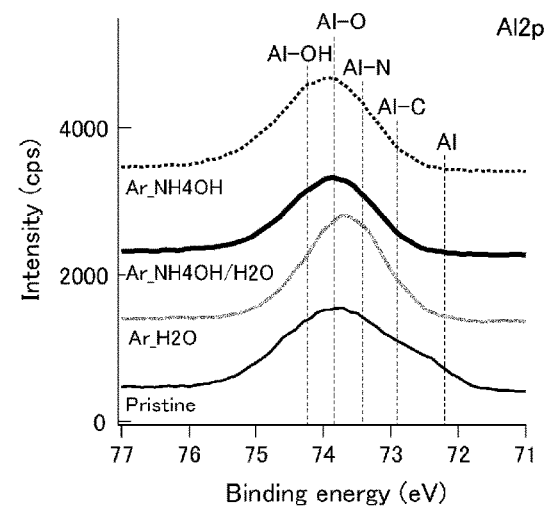

FIG. 15 is a view illustrating X-ray photoelectron spectra obtained on the surface of TiAlC film before and after 10-min exposure to plasma generated with (a) Ar/H$_2$O plasma, (b) Ar/NH$_4$OH/H$_2$O plasma, (c) Ar/NH$_4$OH at 100 W, 0.65 kPa, 150° C., 10 min. In the similar manner with the lower liquid vapor set up, carbon in the bondings with Ti—C, Al—C, and C=O of TiAlC surface are etched by all Ar/liquid vapor plasmas, but the highest rate is in case of only H$_2$O vapor. N—H bonding can be formed in case of ammonium hydroxide mixtures. Nitridation occurs in case of only using ammonium hydroxide vapor with very strong intensity of Ti—N more than Al—N. The shape of Ti 2p is totally different when using ammonium hydroxide vapor plasma with water vapor or ammonium hydroxide/water mixture vapors. In comparison with pristine sample, C is in case of using ammonium hydroxide vapor shows the same tendency, indicating that C—C and carbide bonding still exist on TiAlC surface. This show potential of producing volatile products such as Al$_x$(CH$_3$)$_{3x}$ and Ti(N$_x$(CH$_3$)$_y$)$_z$.

Figure 16:
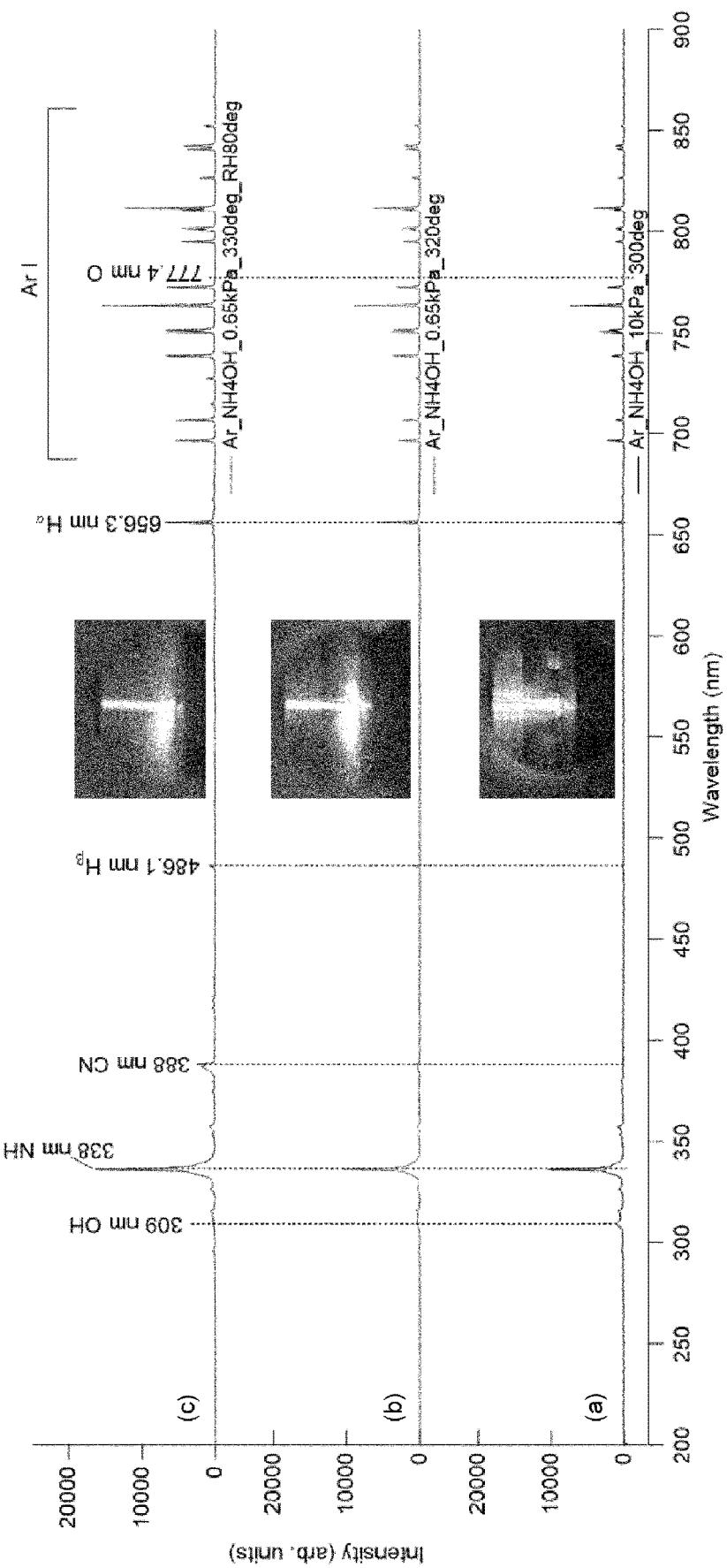
FIG. 16 is a view illustrating optical emission of plasmas generated with Ar/$NH_4OH$ vapor obtained for various conditions: (a) 100 W, 10 kPa, 300° C. (b) 100 W, 0.65 kPa, 320° C. and (c) 100 W, 0.65 kPa, 330° C., liquid canister temperature of 80° C.

FIG. 16 is a view illustrating optical emission of plasmas generated with Ar/NH$_4$OH vapor obtained for various conditions: (a) 100 W, 10 kPa, 300° C. (b) 100 W, 0.65 kPa, 320° C. and (c) 100 W, 0.65 kPa, 330° C., liquid canister temperature of 80° C. The plasma volume is expanded when reduces the pressure from 10 kPa to 1 kPa. NH, H$_\beta$, H$_\alpha$, emission lines are detected in spectra. NH radical intensity increased in case of heating up the canister, and CN radical also can be detected at 0.65 kPa. A weak OH radical is detected in plasma at 10 kPa.

Figure 17:
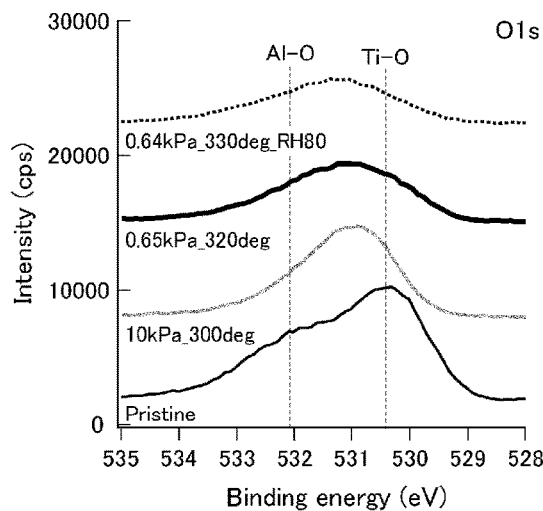
FIG. 17 is a view illustrating X-ray photoelectron spectra obtained on the surface of TiAlC film before and after 20-min exposure to plasma generated at various conditions: (a) 10 kPa, 300° C., (b) 0.65 kPa, 320° C. and (c) 0.64 kPa, 330° C., liquid canister temperature of 80° C.
Figure 17:
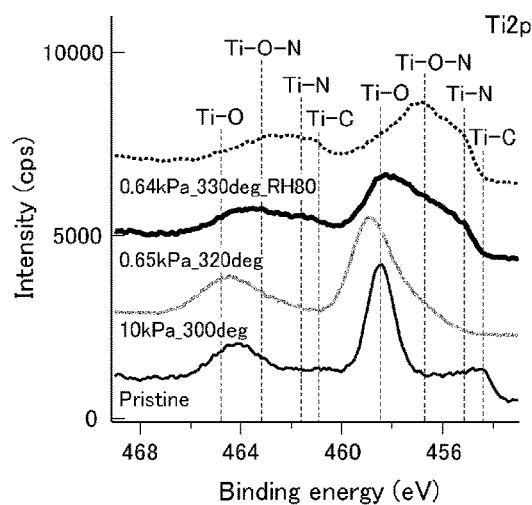
Figure 17:
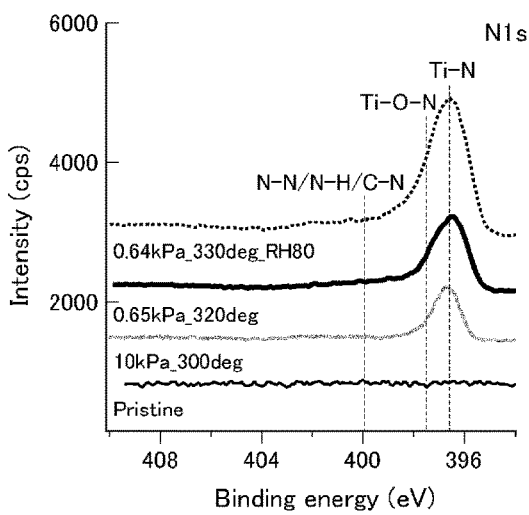
Figure 17:
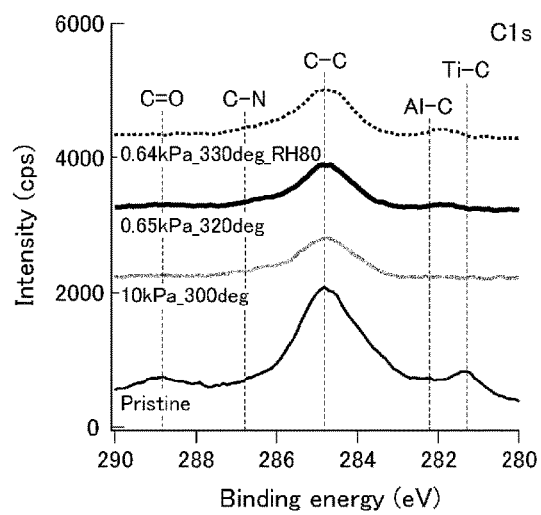
Figure 17:
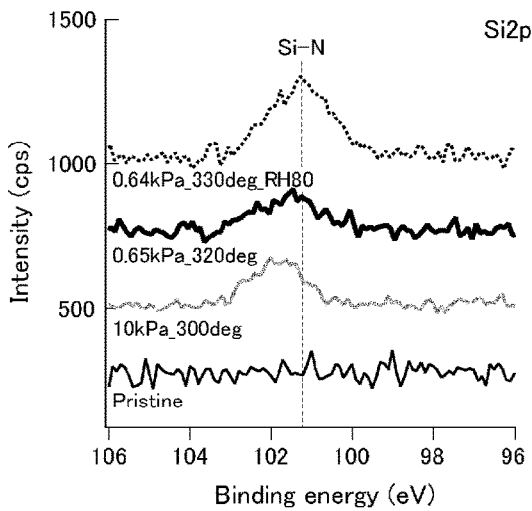
Figure 17:
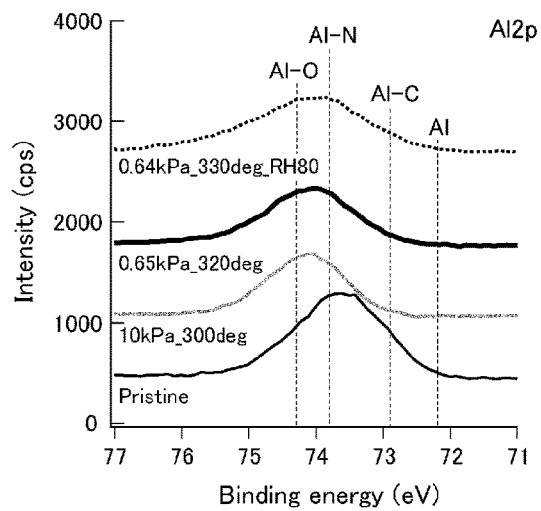

FIG. 17 is a view illustrating X-ray photoelectron spectra obtained on the surface of TiAlC film before and after 20-min exposure to plasma generated at various conditions: (a) 10 kPa, 300° C., (b) 0.65 kPa, 320° C. and (c) 0.64 kPa, 330° C., liquid canister temperature of 80° C. Nitridation of TiAlC occurred more obviously at lower pressure (0.65 kPa) and higher canister heating temperature (80° C.). Formation of oxide (hydroxides) or nitride is a result of OH (or O) and NH ratio. Very small amount of O (or OH) leads to removal of C in Ti—C, Al—C bonding. Therefore, to control forming volatile products such as $Al_x(CH_3)_{3x}$ and $Ti(N_x(CH_3)_y)_z$, formation of $CH_x$ bonding and Ti—$N_x$—$CH_y$ bonding is important.

Table 2 presents film thickness of TiAlC film and the result of continuous plasma etching of TiAlC film by using $Ar/H_2O$, $Ar/NH_4OH/H_2O$, $Ar/NH_4OH$ liquid mixture. Film thickness was evaluated by using ellipsometer. Without using additional heating steps, etching of TiAlC film was detected at etching rate of 0.14 nm/min for $Ar/H_2O$, 0.17 nm/min for $Ar/NH_4OH/H_2O$, and 0.17 nm/min for $Ar/NH_4OH$, respectively.

TABLE 2

| | Pristine TiAlC | | After vapor/plasma etching | | | |
|---|---|---|---|---|---|---|
| Etch time (min) | FT (oxide) | FT (TiAlC) (nm) | FT (oxide, modified layer) (nm) | FT (TiAlC) (nm) | ET (min) | ER-TiAlC (nm/min) |
| $Ar/H_2O$ | 5.11 | 30.87 | 11.96 | 29.51 | 10 | 0.14 |
| $Ar/NH_4OH/H_2O$ | 4.77 | 30.37 | 7.40 | 28.67 | 10 | 0.17 |
| $Ar/NH_4OH$ | 5.51 | 29.73 | 7.86 | 28.06 | 10 | 0.17 |

Figure 18:
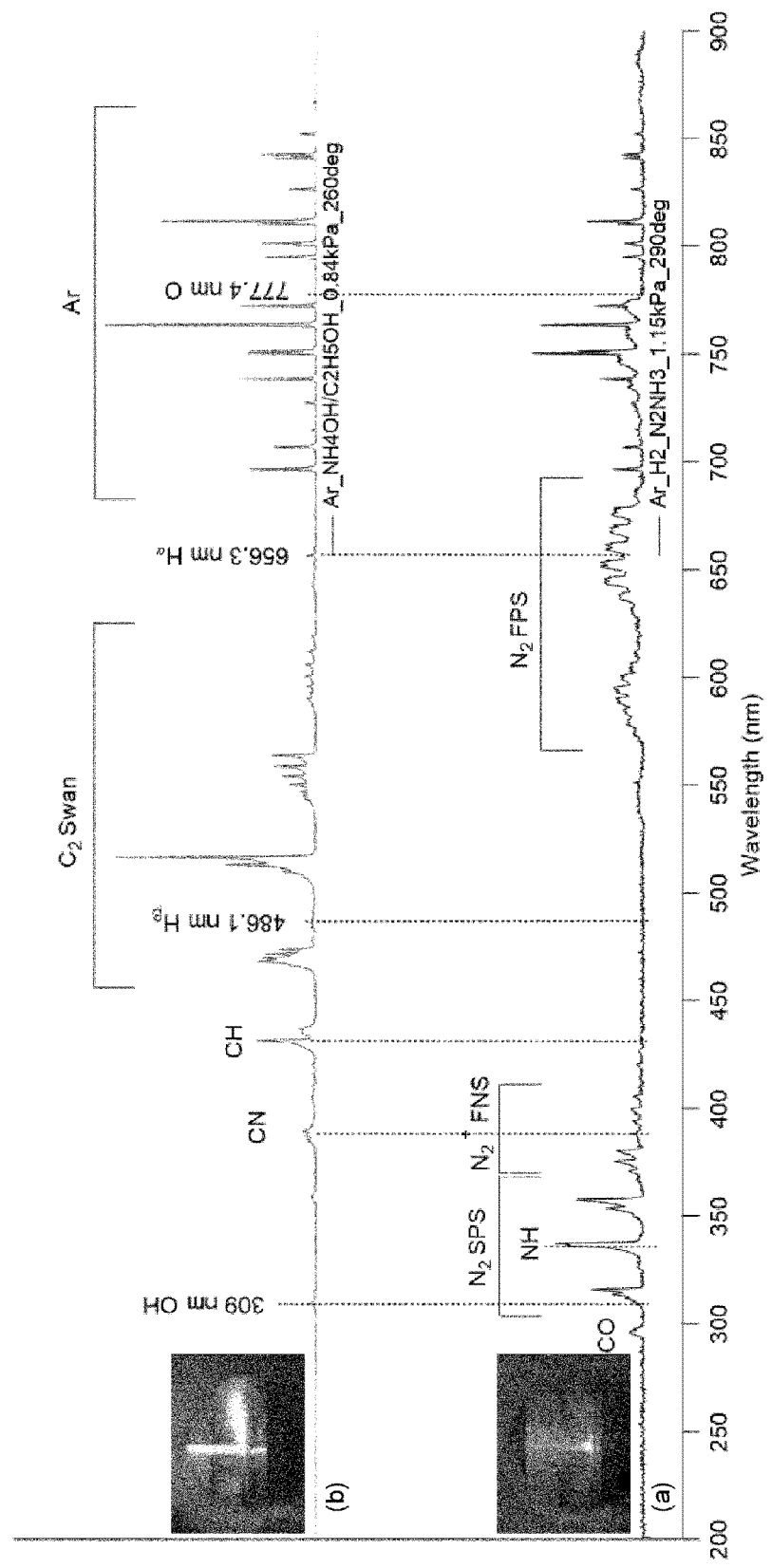
FIG. 18 is a view illustrating optical emission of plasmas generated with (a) Ar/$H_2$/$N_2$/$NH_3$ at 1.15 kPa, substrate temperature of 290° C. and (b) Ar/$NH_4OH$/$C_2H_5OH$ at 0.84 kPa, substrate temperature of 260° C.

To gain concentrations of carbon precursor, hydrocarbon sources can be increased its density of CH, CN, and $C_2$ radicals. These carbon radicals enhance the formation of rich-carbon volatile products. FIG. 18 is a view illustrating optical emission of plasmas generated with (a) $Ar/H_2/N_2/NH_3$ at 1.15 kPa, substrate temperature of 290° C. and (b) $Ar/NH_4OH/C_2H_5OH$ at 0.84 kPa, substrate temperature of 260° C. Very strong $N_2$ molecular radical is detected in case of using $Ar/H_2/N_2/NH_3$. NH emission line is detected with overlapped to $N_2$ SPS in spectra. In case of using $Ar/NH_4OH/C_2H_5OH$, CH, $C_2$ swan, $H_\beta$ emission lines are detected. A weak OH radical is detected, and no obvious NH emission line can be found.

Figure 19:
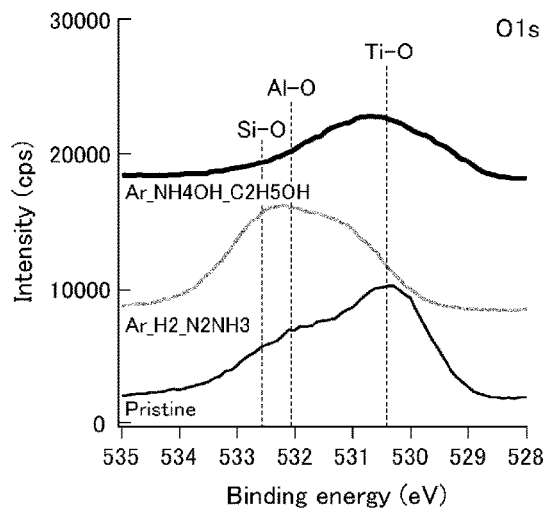
FIG. 19 is a view illustrating X-ray photoelectron spectra obtained on the surface of TiAlC film before and after exposure to plasma generated with (a) Ar/$H_2$/$N_2$/$NH_3$ at 1.15 kPa, substrate temperature of 290° C., 20 min and (b) Ar/$NH_4OH$/$C_2H_5OH$ at 0.84 kPa, substrate temperature of 260° C., 10 min.
Figure 19:
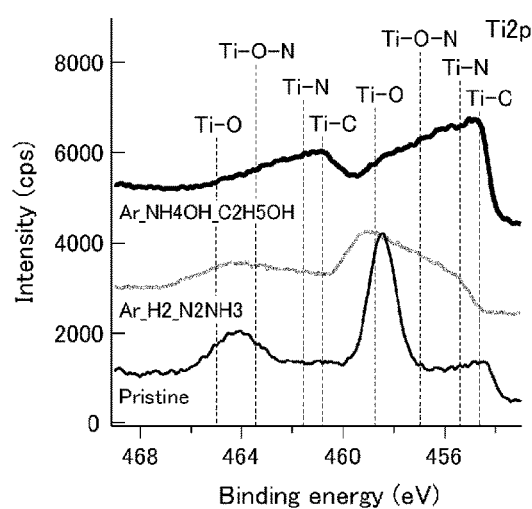
Figure 19:
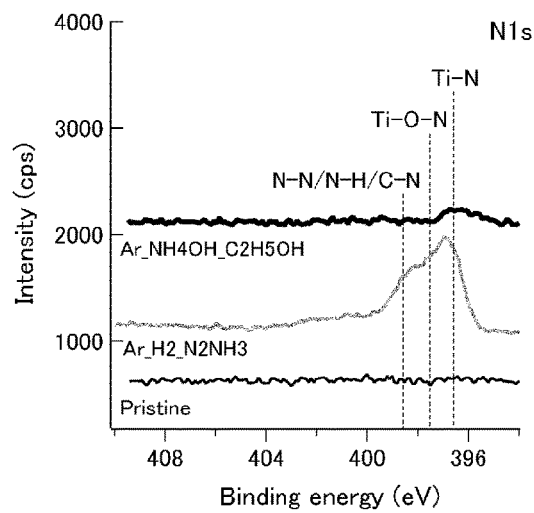
Figure 19:
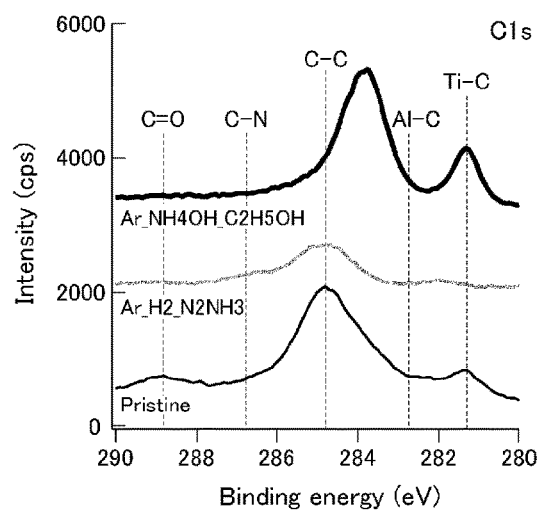
Figure 19:
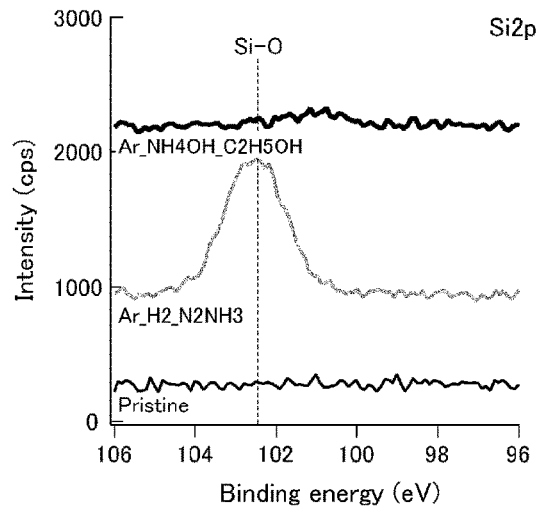
Figure 19:
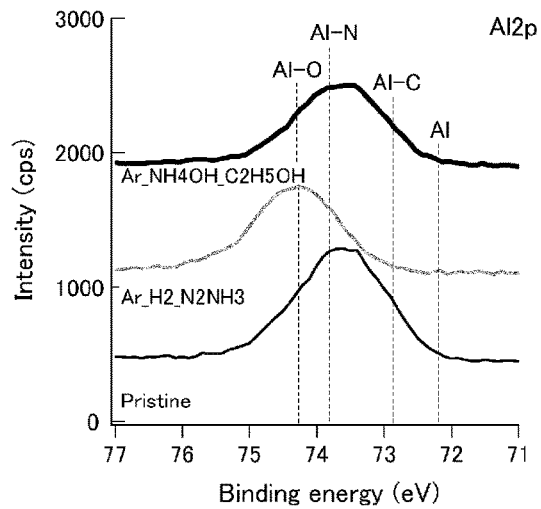

FIG. 19 is a view illustrating X-ray photoelectron spectra obtained on the surface of TiAlC film before and after exposure to plasma generated with (a) $Ar/H_2/N_2/NH_3$ at 1.15 kPa, substrate temperature of 290° C., 20 min and (b) $Ar/NH_4OH/C_2H_5OH$ at 0.84 kPa, substrate temperature of 260° C., 10 min. Nitridation occurred in case of using $Ar/H_2/N_2/NH_3$ plasma. Carbonization occurred in case of using $Ar/NH_4OH/C_2H_5OH$ plasma with stronger peaks of TiC and AlC as compared with pristine sample. A weak Ti—N peak is detected when using $Ar/NH_4OH/C_2H_5OH$ plasma. The ratio of $NH_4OH$ and $C_2H_5OH$ with the formation of $CH_x$ bonding and Ti—$N_x$—$CH_y$ bonding should be controlled to obtain volatile products.

Example of 300-mm Wafer Application

Figure 20:
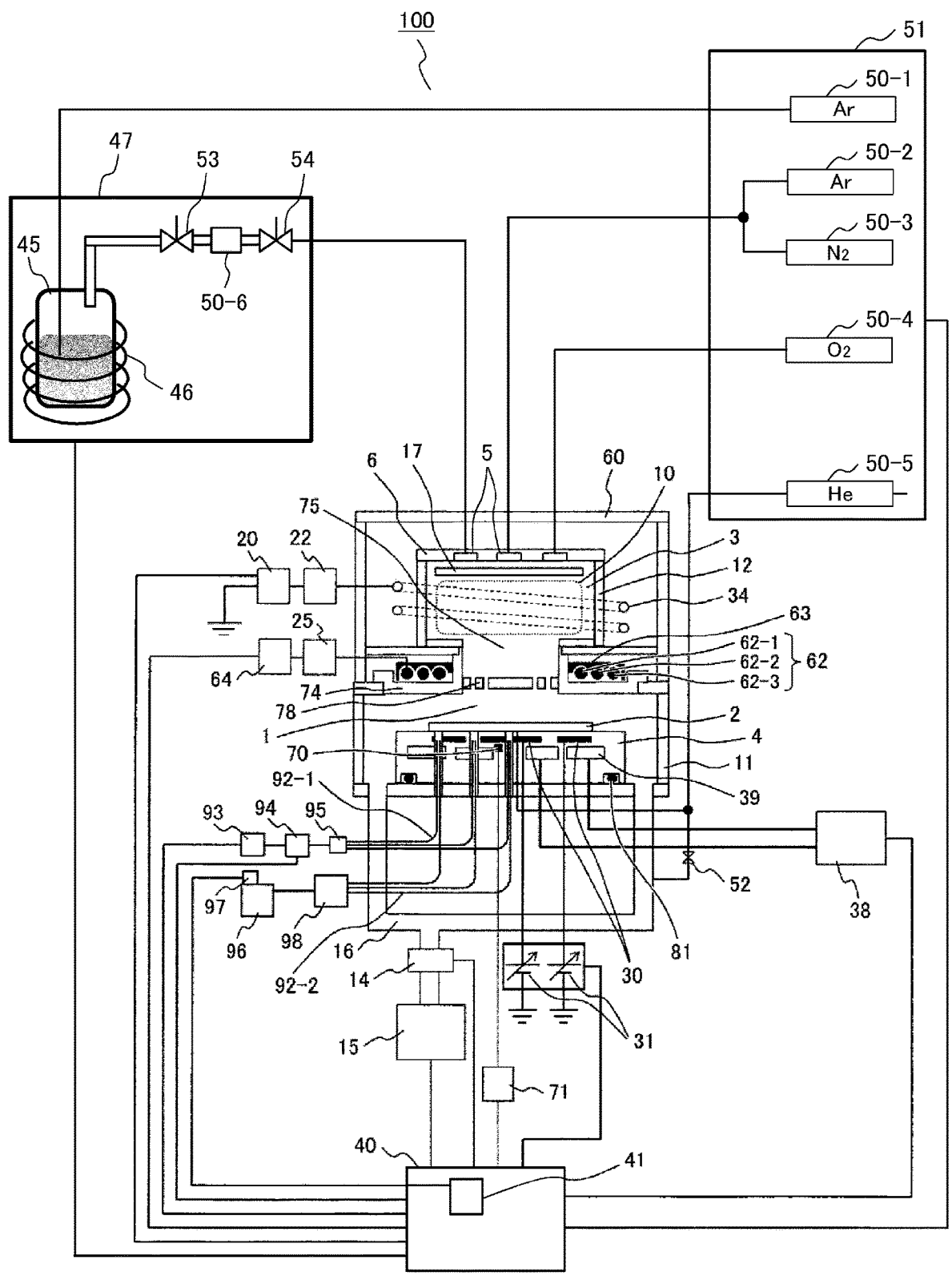
FIG. 20 is a schematic cross-sectional view of an etching apparatus according to an embodiment of the invention.

Description will be given of an embodiment with reference to FIG. 20 to FIG. 22. This embodiment corresponds to an example in which reactive species, which are generated with plasma of a vapor of a mixture that includes $NH_4OH$, are used, and a metal carbide film on a metal nitride film is selectively etched in a plasma processing apparatus for a 300-mm wafer.

The plasma processing apparatus that performs etching of the film containing titanium aluminum carbide as described above will be described. FIG. 20 is a sectional view illustrating a schematic configuration of a plasma processing apparatus 100.

A processing chamber 1 is configured with a base chamber 11; a wafer stage 4 (hereinafter, referred to as stage 4) on which a wafer 2 serving as a sample to be processed is placed is disposed in the processing chamber 1. A plasma source, which includes a quartz chamber 12, an ICP coil 34, and a high frequency electric power supply 20, is disposed in a container 60 disposed above the base chamber 11. In the example, an inductively coupled plasma (ICP) electric discharge method is used for the plasma source. The high frequency electric power supply 20 that generates plasma is connected to the ICP coil 34 outside the cylindrical quartz chamber 12 via a matching unit 22. A frequency band of tens of MHz, such as 13.56 MHz, is used as a frequency of high frequency electric power.

A top plate 6 is disposed at an upper portion of the quartz chamber 12. Shower plates 5 are disposed in the top plate 6. A gas dispersion plate 17 is disposed below the top plate 6. The processing gas is introduced into the processing chamber 1 from an outer periphery of the gas dispersion plate 17.

A supply flow rate of the processing gas is adjusted by mass flow controllers 50 disposed for each type of gas in the processing gas. FIG. 20 illustrates an example of using Ar, $N_2$, and $O_2$ as the processing gas. However, gas types in the processing gases are not limited thereto.

On the other hand, when the vapor of the mixture of $NH_4OH$ and $H_2O_2$ and $H_2O$ is used as the etching gas, an aqueous solution is used. For this reason, a vapor supplier 47 vaporizes the aqueous solution. The vapor supplier 47 includes a tank 45 that houses the aqueous solution. The aqueous solution is heated by a heater 46 that covers a periphery of the tank 45, and Ar gas is supplied by using a mass flow controller 50-1, so that an upper portion of the tank 45 is filled with vapor of the liquid complexation agent. The generated vapor is introduced into the processing chamber 1 with a flow rate of the generated vapor controlled by the mass flow controller 50-6. When the vapor is not introduced into the processing chamber 1, valves 53 and 54 are closed, and the aqueous solution is shut off from the processing chamber 1.

A vacuum exhaust pipe 16 is connected to a pump 15 to reduce pressure at a lower portion of the processing chamber 1. The pump 15 is configured with, for example, a turbo molecular pump, a mechanical booster pump, or a dry pump. In order to adjust pressure of an electric discharge region 3 in the processing chamber 1 or the quartz chamber 12, a pressure adjustment mechanism 14 is disposed upstream of the pump 15. The pressure adjustment mechanism 14, the pump 15, and the vacuum exhaust pipe 16 are collectively referred to as an exhaust mechanism. The stage 4 is provided with an O-ring 81 that performs vacuum-sealing between the stage 4 and a bottom surface of the base chamber 11.

An infrared (IR) lamp unit that heats the wafer 2 is disposed between the stage 4 and the quartz chamber 12 that constitutes the ICP plasma source. The IR lamp unit mainly includes an IR lamp 62, a reflection plate 63 that reflects IR light, and an IR light transmission window 74. A circular (round-shaped) lamp is used as the IR lamp 62. Light (electromagnetic wave) emitted from the IR lamp 62 is light (herein referred to as IR light) mainly including light from visible light to light in an infrared light region. In the example, the IR lamp 62 includes IR lamps 62-1, 62-2, and 62-3 for three rounds. However, the IR lamp 62 may include IR lamps for two or four rounds. The reflection plate 63 that reflects the IR light downward (in a placement direction of the wafer 2) is disposed above the IR lamp 62.

An IR lamp electric power supply 64 is connected to the IR lamp 62. A high frequency cut-off filter 25 is disposed between the IR lamp electric power supply 64 and the IR lamp 62. The high frequency cut-off filter 25 prevents noise of high frequency electric power for generating plasma produced by the high frequency electric power supply 20 from flowing into the IR lamp electric power supply 64. The IR lamp electric power supply 64 has a function of independently controlling electric power supplied to the respective IR lamps 62-1, 62-2 and 62-3, so that radial distribution of a heating amount of the wafer 2 can be adjusted.

In the example, a gas flow path 75 is formed in a center of the IR lamp unit since the gas supplied into the quartz chamber 12 flows into the processing chamber 1. The gas flow path 75 is provided with a slit plate (ion shielding plate) 78 that shields ions and electrons in the plasma generated inside the quartz chamber 12 and that transmits only a neutral gas or neutral radicals to irradiate the wafer 2. The slit plate 78 includes a plurality of holes.

On the other hand, a refrigerant flow path 39 is formed in the stage 4 to cool the stage 4; a refrigerant is supplied and circulated by a chiller 38. In order to fix the wafer 2 to the stage 4 by electrostatic attraction, electrodes 30 for electrostatic attraction, which are plate-shaped electrode plates, are embedded in the stage 4. DC electric power supplies 31 for electrostatic attraction are respectively connected to the electrodes 30 for electrostatic attraction.

In order to efficiently cool the wafer 2, a He gas (cooling gas) can be supplied between the stage 4 and a back surface of the wafer 2 placed on the stage 4. A surface (a placement surface of the wafer) of the stage 4 is coated with resin such as polyimide to prevent the back surface of the wafer 2 from being damaged even when the electrodes 30 for electrostatic attraction are operated to perform heating and cooling while the wafer 2 is electrostatically attracted. A thermocouple 70 that measures a temperature of the stage 4 is disposed inside the stage 4 and is connected to a thermocouple thermometer 71.

Optical fibers 92-1 and 92-2 are disposed at three places to measure temperatures of the wafer 2, that is, a place near a center portion of the wafer 2 placed on the stage 4, a place near a middle portion of the wafer 2 in a radial direction, and a place near an outer periphery of the wafer 2. The optical fiber 92-1 guides the IR light from an external IR light source 93 to the back surface of the wafer 2, so that the back surface of the wafer 2 is irradiated with the IR light. On the other hand, the optical fiber 92-2 collects the IR light transmitted through or reflected on the wafer 2 among the IR light emitted by the optical fiber 92-1, and transmits the transmitted or reflected IR light to a spectroscope 96. That is, the external IR light generated by the external IR light source 93 is transmitted to an optical path switch 94 that turns on and off an optical path. Thereafter, the external IR light is branched into a plurality of pieces of light (three in this case) by a light distributor 95, and various positions on the back surface of the wafer 2 are irradiated with the plurality of pieces of IR light via three optical fibers 92-1. The IR light absorbed or reflected by the wafer 2 is transmitted to the spectroscope 96 by the optical fiber 92-2 and data of wavelength dependency of a spectral intensity is obtained by a detector 97. The data of the wavelength dependency of the spectral intensity obtained by the detector 97 is sent to an arithmetic unit 41 of a control unit 40 to calculate an absorption wavelength, and the temperature of the wafer 2 can be determined based on the absorption wavelength. An optical multiplexer 98 is disposed on an intermediate portion of the optical fiber 92-2, so that it is possible to switch light to be subjected to spectroscopic measurement at measurement points of the center of the wafer, the middle of the wafer, and the outer periphery of the wafer. Accordingly, the arithmetic unit 41 can determine the respective temperatures of the center of the wafer, the middle of the wafer, and the outer periphery of the wafer.

The control unit 40 controls each mechanism that constitutes the plasma processing apparatus 100. Specifically, the control unit 40 controls the high frequency electric power supply 20 and controls ON and OFF of a high frequency electric power supply to the ICP coil 34. A gas supply unit 51 is controlled to adjust the types and flow rates of gases supplied from the respective mass flow controllers 50-1 to 50-5 to inside of the quartz chamber 12. Alternatively, the vapor supplier 47 is controlled to adjust the flow rate of the vapor supplied from the mass flow controller 50-6 to the inside of the quartz chamber 12. When the etching gas is supplied, the control unit 40 operates the pump 15 and controls the pressure adjustment mechanism 14 to adjust pressure inside the processing chamber 1 to a desired pressure.

While operating the DC electric power supplies 31 for electrostatic attraction to electrostatically attract the wafer 2 to the stage 4, and operating the mass flow controller 50-5 that supplies the He gas between the wafer 2 and the stage 4, the control unit 40 controls the IR lamp electric power supply 64 and the chiller 38 based on the temperature in the stage 4 measured by the thermocouple thermometer 71 as well as information on temperature distribution of the wafer 2 determined by the arithmetic unit 41, so that the temperature of the wafer 2 falls within a predetermined temperature range. The information on temperature distribution of the wafer 2 is determined based on information on spectral intensities near the center portion of the wafer 2, near the middle portion of the wafer 2 in the radial direction, and near the outer periphery of the wafer 2, which are measured by the detector 97.

Figure 21:
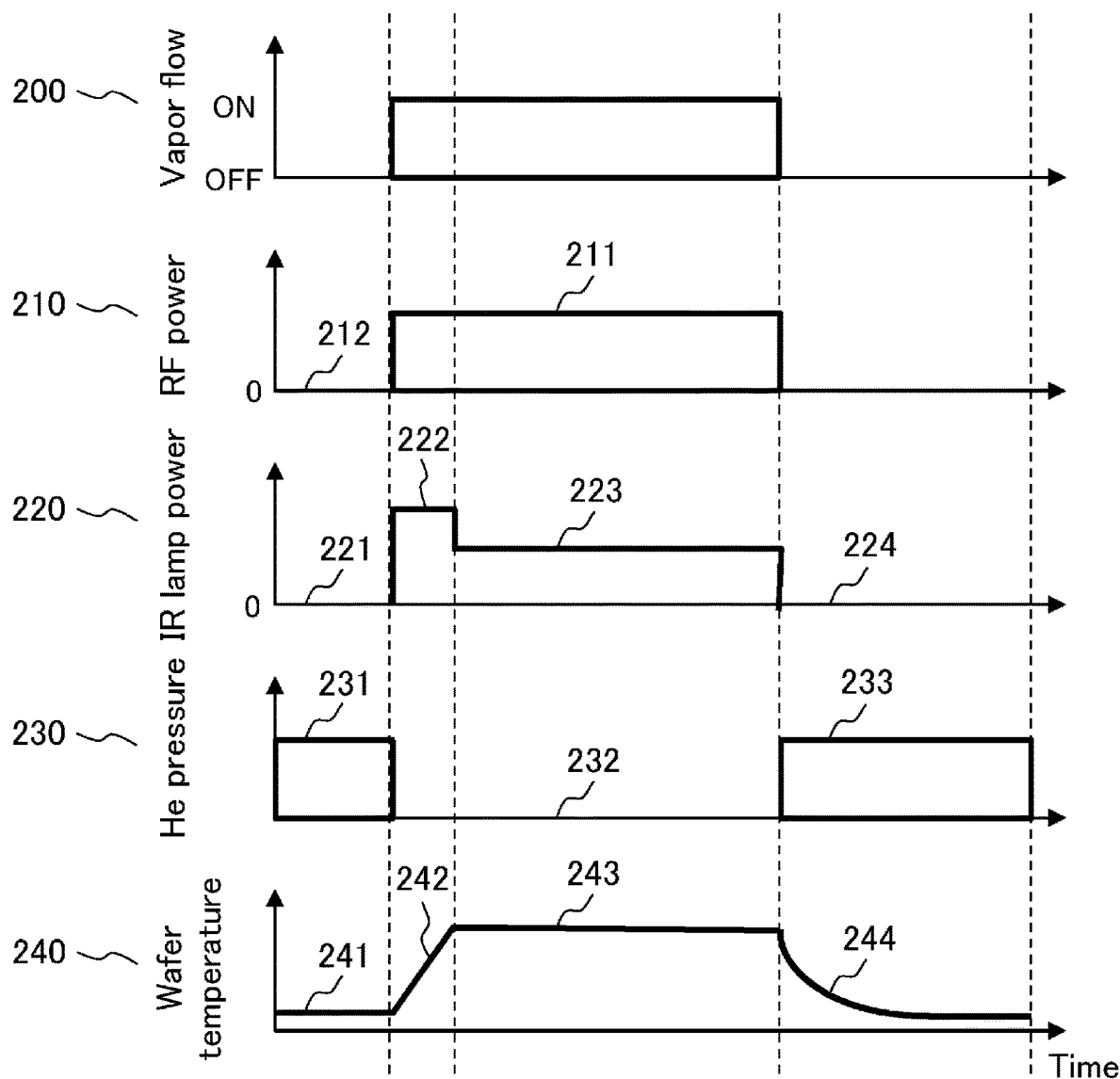
FIG. 21 is a schematic view illustrating an example of a temporal variation of parameters in the continuous etching according to an embodiment of the invention, and a processing vapor flow rate, a radio frequency power supply power, infrared lamp power, a rear surface He flow rate, and a wafer surface temperature in this order from an upper end.

A schematic view of FIG. 21 illustrates a procedure in the continuous etching method of the titanium aluminum carbide film according to this embodiment, and illustrates a variation of apparatus parameters in respective processes of the etching. The continuous etching is performed by the plasma processing apparatus 100 using a vapor of a mixture of $NH_4OH$ and $H_2O_2$ and $H_2O$ as an etching agent that is used for the generation of plasma. Here, a temporal variation of a processing vapor flow rate 200, radio frequency power supply power 210, infrared lamp power 220, a rear surface He flow rate 230, and a wafer surface temperature 240 in the etching are illustrated. Hereinafter, the continuous etching of the titanium aluminum carbide film related to this embodiment will be described in detail with reference to FIG. 20 to FIG. 21.

First, the wafer 2, on which the metal film containing titanium aluminum carbide to be etched is formed, is carried into the processing chamber 1 via a transport port (not shown) provided in the processing chamber 1 and is placed on the stage 4. The control unit 40 operates the DC electric power supplies 31 to electrostatically attract and fix the wafer 2 to the stage 4, and controls the gas supply unit 51 to supply the He gas for wafer cooling between the back surface of the wafer 2 and the stage 4 from the mass flow controller 50-5 corresponding to the He gas, so that pressure 230 of the He gas between the back surface of the wafer 2 and the stage 4 is set to a predetermined pressure 231 and a wafer temperature 240 is set to a temperature 241. In the example, the wafer temperature 241 is 25° C. Then, the supply of the He gas to the back surface of the wafer is stopped, the valve 52 is opened, and the pressure on the back surface of the wafer 2 is set equal to the pressure in the processing chamber 1. The He gas on the back surface of the wafer is removed, whereby the pressure 230 of the He gas on the back surface of the wafer 2 is set to pressure 232.

Subsequently, the control unit 40 adjusts a flow rate of the vapor, which is a mixture of $NH_4OH$ and $H_2O_2$ and $H_2O$ in Ar gas, is supplied into the processing chamber 1 by the mass flow controller 50-6, and adjusts an opening degree of the pressure adjustment mechanism 14, so that pressure inside the processing chamber 1 and pressure inside the quartz chamber 12 are set to target pressure. In the state, the control unit 40 turns on the high frequency electric power supply 20 to apply discharging electric power 211, thereby starting plasma electric discharge inside the quartz chamber 12 and generating plasma 10 inside the quartz chamber 12. At this time, the control unit 40 turns on an output of the IR lamp electric power supply 64 to turn on the IR lamp 62 (electric power 222). The IR light emitted from the IR lamp 62 passes through the IR light transmission window 74 and heats the wafer 2. Accordingly, the temperature of the wafer is raised as indicated as a wafer temperature 242. The wafer temperature 240 reaches 200° C. 35 seconds after the start of the temperature raising.

Once the wafer temperature 240 reaches 200° C. (wafer temperature 243), the control unit 40 reduces the output of the IR lamp electric power supply 64 to electric power 223, thereby keeping the temperature of the wafer 2 constant at the temperature 243 for a certain period of time. In this manner, the vapor is continuously supplied in a state where the temperature of the wafer 2 is maintained at 200° C. Pressure is set as 500 Pa, and a flow rate of the vapor is set as 1000 sccm. The titanium aluminum carbide layer reacts with the reactive agents including OH, NH and $NH_2$ which adsorbed on the surface thereof, so that a reaction product including $Ti(OH)_4$ formed on the film surface and evaporate and the thickness of the titanium aluminum carbide is reduced. The entire titanium aluminum carbide layer is removed, so that the etching is stopped and a titanium nitride layer is exposed.

In the state, a part of the vapor is ionized and dissociated in the plasma 10. The neutral gas and the neutral radicals which are not ionized in the region where the plasma 10 is generated pass through the slit plate 78 so that the wafer 2 is irradiated with the neutral gas and the neutral radicals. The radicals are adsorbed on the surface of the wafer 2 and react with the titanium aluminum carbide film to generate the volatile reaction product. Due to the effect of the slit plate 78, ions generated in the plasma 10 hardly enter the wafer 2. Therefore, the etching of the titanium aluminum carbide film mainly isotropically proceeds by the radicals. The time for plasma processing using the vapor is set to 60 seconds.

After the plasma processing time required to etch the titanium aluminum carbide layer has elapsed, the control unit 40 turns off the high frequency electric power supply 20 (discharging electric power 212) and stops the plasma electric discharge. The gas remaining in the processing chamber 1 is exhausted by the exhaust mechanism.

Thereafter, the control unit 40 turns off the output of the IR lamp electric power supply 64 (electric power 224) and stops the heating of the wafer 2. The above is the continuous etching process.

Subsequently, the control unit 40 controls the mass flow controller 50-1 for Ar gas supply and the mass flow controller 50-4 for He gas supply to supply an Ar gas into the processing chamber 1 and supply the He gas between the back surface of the wafer 2 and the stage 4, so that the pressure 230 of the He gas between the back surface of the wafer 2 and the stage 4 is set to a predetermined pressure 233 and the cooling of the wafer 2 is started (temperature 244). The wafer temperature is cooled to 20° C. and time required for the cooling is 30 seconds. Therefore, the whole etching process is terminated.

Figure 22:
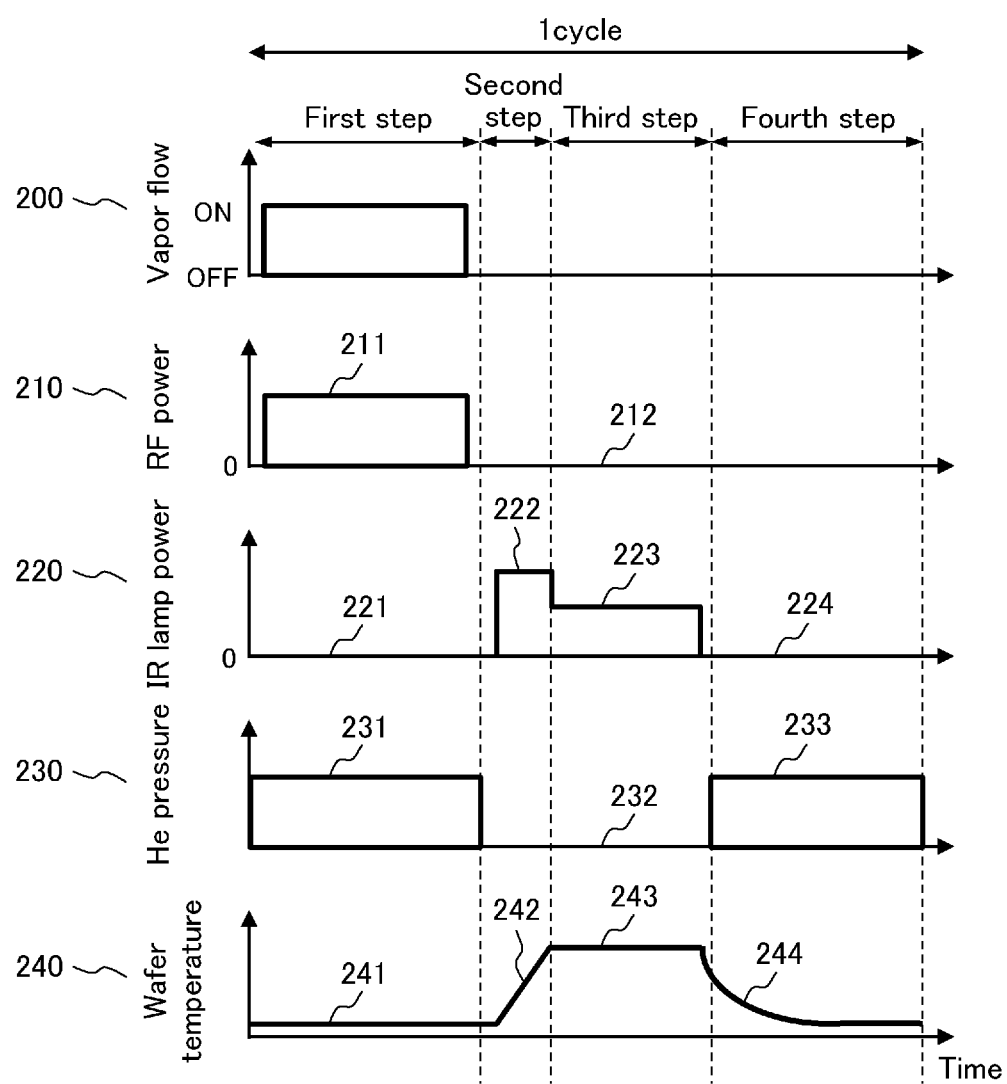
FIG. 22 is a schematic view illustrating an example of a temporal variation of parameters in the atomic layer etching according to an embodiment of the invention, and a processing vapor flow rate, a radio frequency power supply power, infrared lamp power, a rear surface He flow rate, and a wafer surface temperature in this order from an upper end.

FIG. 22 is a time chart for one cycle when atomic layer etching of the metal carbide film is performed by the plasma processing apparatus 100.

First, the wafer 2, on which the metal carbide film such as titanium carbide to be etched is formed, is carried into the processing chamber 1 via a transport port (not shown) provided in the processing chamber 1 and is placed on the stage 4. The control unit 40 operates the DC electric power supplies 31 to electrostatically attract and fix the wafer 2 to the stage 4, and controls the gas supply unit 51 to supply the He gas for wafer cooling between the back surface of the wafer 2 and the stage 4 from the mass flow controller 50-4 corresponding to the He gas, so that pressure 230 of the He gas between the back surface of the wafer 2 and the stage 4 is set to a predetermined pressure 231 and a wafer temperature 240 is set to a temperature 241. In the example, the wafer temperature 241 is 20° C.

Subsequently, the control unit 40 adjusts a flow rate of the vapor, which is a mixture of $NH_4OH$ and $H_2O$, which is the reaction gas supplied into the processing chamber 1 by the mass flow controller 50-6, and adjusts an opening degree of the pressure adjustment mechanism 14, so that pressure inside the processing chamber 1 and pressure inside the quartz chamber 12 are set to target pressure. In the state, the control unit 40 turns on the high frequency electric power supply 20 to apply discharging electric power 211, thereby starting plasma electric discharge inside the quartz chamber 12 and generating plasma 10 inside the quartz chamber 12. At this time, since the temperature of the wafer 2 is maintained at 20° C., an electric power 220 applied to the IR lamp 62 is zero (electric power 221).

In the state, a part of the mixture of $NH_4OH$ and $H_2O$ is ionized and dissociated in the plasma 10. The neutral gas and the neutral radicals which are not ionized in the region where the plasma 10 is generated pass through the slit plate 78 so that the wafer 2 is irradiated with the neutral gas and the neutral radicals including NH and OH. The radicals are adsorbed on the surface of the wafer 2 and react with the TiC film to generate the surface reaction layer including $Ti((N)CH_3)_2)_4$ layer. Due to the effect of the slit plate 78, ions generated in the plasma 10 hardly enter the wafer 2. Therefore, the surface reaction of the TiC film mainly isotropically proceeds by the radicals, and a surface reaction layer is generated on a surface of a TiC film. A thickness of the generated surface reaction layer increases depending on plasma processing time using the vapor and a plasma processing temperature. However, an amount of surface reaction layer is saturated when 10 seconds have elapsed at the temperature in this case. Therefore, the time for plasma processing using the vapor is set to 10 seconds.

After the plasma processing time required to form the surface reaction has elapsed, the control unit 40 turns off the high frequency electric power supply 20 (discharging electric power 212) and stops the plasma electric discharge. The gas remaining in the processing chamber 1 is exhausted by the exhaust mechanism. The supply of the He gas to the back surface of the wafer is stopped, the valve 52 is opened, and the pressure on the back surface of the wafer 2 is set equal to the pressure in the processing chamber 1. The He gas on the back surface of the wafer is removed, whereby the pressure 230 of the He gas on the back surface of the wafer is set to pressure 232. The above is the first step.

Subsequently, the control unit 40 turns on an output of the IR lamp electric power supply 64 to turn on the IR lamp 62 (electric power 222). The IR light emitted from the IR lamp 62 passes through the IR light transmission window 74 and heats the wafer 2. Accordingly, the temperature of the wafer is raised as indicated as a wafer temperature 242. The wafer temperature 240 reaches 200° C. 25 seconds after the start of the temperature raising when the second step is terminated. In the example, the wafer temperature to be reached is set to 200° C.

Once the wafer temperature 240 reaches 200° C. (wafer temperature 243), the control unit 40 reduces the output of the IR lamp electric power supply 64 to electric power 223, thereby keeping the temperature of the wafer 2 constant at the temperature 243 for a certain period of time. Pressure is set as 500 Pa. The $Ti((N)CH_3)_2)_4$ layer is removed because it is volatile at the elevated temperature so that the thickness of the TiC film is reduced. The entire surface reaction layer is removed, so that the etching is stopped and a surface of TiC layer is exposed.

In the second step and the present step (the third step), the wafer 2 is heated by the electromagnetic wave from the IR lamp 62, so that a surface of the wafer necessarily to be heated can be efficiently warmed. For example, even when there is a temperature difference of about 180° C., the heating can be rapidly completed. Although it is described that the wafer 2 is heated in a state where the wafer 2 is placed on the stage 4, the wafer 2 may be raised from the stage 4 by using a lift pin or the like and irradiated with the IR light (the electromagnetic wave) in a state where the wafer 2 is not in thermal contact with the stage 4. Accordingly, heat transfer from the wafer 2 to the stage 4 can be prevented and the temperature of the wafer 2 can thus be raised to a desired temperature in a shorter time. In this case, the temperature of the wafer 2 may be measured using the light that is emitted from the IR lamp 62, transmits through the wafer 2 and reaches the optical fibers 92-2. A power ratio of the IR lamps 62-1, 62-2 and 62-3 may be controlled based on a radial temperature distribution in a plane of the wafer 2.

Thereafter, the control unit 40 turns off the output of the IR lamp electric power supply 64 (electric power 224) and stops the heating of the wafer 2. The gas remaining in the processing chamber 1 is rapidly exhausted by the exhaust mechanism. Thus, the third step is terminated.

Subsequently, the control unit 40 controls the mass flow controller 50-1 for Ar gas supply and the mass flow controller 50-4 for He gas supply to supply an Ar gas into the processing chamber 1 and supply the He gas between the back surface of the wafer 2 and the stage 4, so that the pressure 230 of the He gas between the back surface of the wafer 2 and the stage 4 is set to a predetermined pressure 233 and the cooling of the wafer 2 is started (temperature 244). The wafer temperature is cooled to 20° C. and time required for the cooling is 30 seconds. Therefore, the fourth step is terminated.

In this manner, in the present embodiment, the surface reaction processing in the first step and the sublimation removal processing in the third step isotropically proceed, so that a thickness of the metal carbide film decreases from an initial metal carbide layer. The cycle including the first to the fourth steps is repeated five times in this example, so that etching of the whole metal carbide film was performed. And the surface of nitride under layer was exposed.

Gases or etching conditions in this example are shown for illustrative purpose. Gases or etching conditions illustrated in the Example Processes 2 to 3 are also applicable to this example.

REFERENCE SIGNS LIST

1: processing chamber, 2: wafer, 3: electric discharge region, 4: wafer stage, 5: shower plates, 6: top plate, 11: base chamber, 12: quartz chamber, 14: pressure adjustment mechanism, 15: pump, 16: vacuum exhaust pipe, 17: gas dispersion plate, 20: high frequency electric power supply, 22: matching unit, 25: high frequency cut-off filter, 30: electrodes, 31: DC electric power supplies, 34: ICP coil, 38: chiller, 39: refrigerant flow path, 40: control unit, 41: arithmetic unit, 45: tank, 46: heater, 47: vapor supplier, 50: mass flow controller, 51: gas supply unit, 53, 54: valve, 60: container, 62: IR lamp, 63: reflection plate, 64: IR lamp electric power supply, 70: thermocouple, 71: thermocouple thermometer, 74: IR light transmission window, 75: gas flow path, 78: slit plate (ion shielding plate), 81: O-ring, 92: optical fiber, 93: external IR light source, 94: optical path switch, 95: light distributor, 96: spectroscope, 97: detector, 98: optical multiplexer, 100: plasma processing apparatus, 101: discharge tube, 102: Cu coil, 103: long floating metal wire, 104: power supply, 105: copper foil, 106: matching circuit, 107: liquid canister, 110: process chamber, 111: dry pump, 120: sample, 121: heating stage, 130: plasma, 200: vapor flow, 210: RF power, 220: IR lamp power, 230: He pressure, 240: wafer temperature.

The invention claimed is:

1. An etching method for etching a metal carbide film, comprising:
   a process of supplying non-halogen reactive species, which include NH and H, to a base material that includes a metal carbide film on at least a part of a surface with a metal nitride film; and
   a selective etching process of the metal carbide to the metal nitride by forming volatile products in the process.

2. The etching method according to claim 1,
   wherein the reactive species further include $CH_x$ radicals in which X=1 to 3.

3. An etching method for etching a metal carbide film, comprising:
   a process of supplying reactive species which include NH and H to a base material that includes a metal carbide film on at least a part of a surface; and
   a selective etching process of base material to metal nitride by forming volatile products in the process,
   wherein the metal carbide film is titanium aluminum carbide and the metal nitride is titanium nitride.

4. An etching method for etching a metal carbide film, comprising:
- a first process of supplying non-halogen reactive species, with a density ranging from $10^{13}$ per 1 $cm^3$ to $10^{15}$ per 1 $cm^3$, which include NH and H, to a base material that includes a metal carbide film on at least a part of a surface; and
- a second process of selectively etching the base material to metal nitride by forming volatile products by additional heating to remove a surface reaction layer that is formed on a surface of the metal carbide film in the first process.

5. The etching method according to claim 4, wherein the reactive species further include $CH_x$ radicals in which X=1 to 3.

6. The etching method according to claim 4, wherein a combination of the first process and the second process is set as one cycle, and a plurality of the cycles are repeated.

7. The etching method according to claim 4, wherein the reactive species are generated by plasma of a non-halogen processing gas that is non-corrosive.

8. An etching method for etching a metal carbide film, comprising:
- a first process of supplying reactive species which include NH and H to a base material that includes a metal carbide film on at least a part of a surface; and
- a selective etching process of base material to metal nitride by forming volatile products by additional heating to remove a surface reaction layer that is formed on a surface of the metal carbide film in the first process, wherein the metal carbide film is titanium aluminum carbide and the metal nitride is titanium nitride.

9. An etching method comprising:
- supplying non-halogen radicals with a density ranging from $10^{13}$ per 1 $cm^3$ to $10^{15}$ per 1 $cm^3$ generated by plasma source with a pressure from 0.5 kPa to 70 kPa to a sample surface including a metal carbide film and a metal nitride film;
- obtaining a reaction layer with a self-limiting effect on a surface of the film of metal carbide; and
- removing the reaction layer.

\* \* \* \* \*